(12) United States Patent
Lautzenhiser

(10) Patent No.: US 8,963,643 B2
(45) Date of Patent: Feb. 24, 2015

(54) METHOD AND SYSTEM FOR PROVIDING AUTOMATIC GATE BIAS AND BIAS SEQUENCING FOR FIELD EFFECT TRANSISTORS

(71) Applicant: Lloyd L Lautzenhiser, Nobel (CA)

(72) Inventor: Lloyd L Lautzenhiser, Nobel (CA)

(73) Assignee: Emhiser Research LimitedCA (US)

( * ) Notice: Subject to any disclaimer, the term of this patent is extended or adjusted under 35 U.S.C. 154(b) by 0 days.

(21) Appl. No.: 14/149,468

(22) Filed: Jan. 7, 2014

(65) Prior Publication Data

US 2014/0333382 A1 Nov. 13, 2014

Related U.S. Application Data

(63) Continuation-in-part of application No. 13/072,474, filed on Mar. 25, 2011, now Pat. No. 8,188,794, and a continuation of application No. 13/481,906, filed on May 28, 2012, now Pat. No. 8,624,675.

(60) Provisional application No. 61/340,960, filed on Mar. 25, 2010.

(51) Int. Cl.
*H03G 3/10* (2006.01)
*H03G 3/30* (2006.01)
*H03F 3/193* (2006.01)

(52) U.S. Cl.
CPC ............. *H03G 3/3036* (2013.01); *H03F 3/193* (2013.01); *H03F 2200/451* (2013.01); *H03F 2200/24* (2013.01)
USPC .......................................... 330/285; 330/296

(58) Field of Classification Search
USPC ......................................... 330/285, 296, 289
See application file for complete search history.

(56) References Cited

U.S. PATENT DOCUMENTS

| | | | | |
|---|---|---|---|---|
| 6,838,932 B2* | 1/2005 | Izumiyama et al. | ............ | 330/51 |
| 7,109,800 B2* | 9/2006 | Noh et al. | ...................... | 330/296 |
| 7,242,252 B2* | 7/2007 | Taylor | ............................ | 330/296 |

* cited by examiner

*Primary Examiner* — Henry Choe
(74) *Attorney, Agent, or Firm* — Valenti, Hanley & Robinson, PLLC; Kevin T. Duncan

(57) ABSTRACT

A feedback gate bias circuit for use in radio frequency amplifiers to more effectively control operation of LDFET, GaN-FET, GaAsFET, and JFET type transistors used in such circuits. A transistor gate bias circuit that senses drain current and automatically adjusts or biases the gate voltage to maintain drain current independently of temperature, time, input drive, frequency, as well as from device to device variations. Additional circuits to provide temperature compensation, RF power monitoring and drain current control, RF output power leveler, high power gain block, and optional digital control of various functions. A gate bias circuit including a bias sequencer and negative voltage deriver for operation of N-channel depletion mode devices.

3 Claims, 24 Drawing Sheets

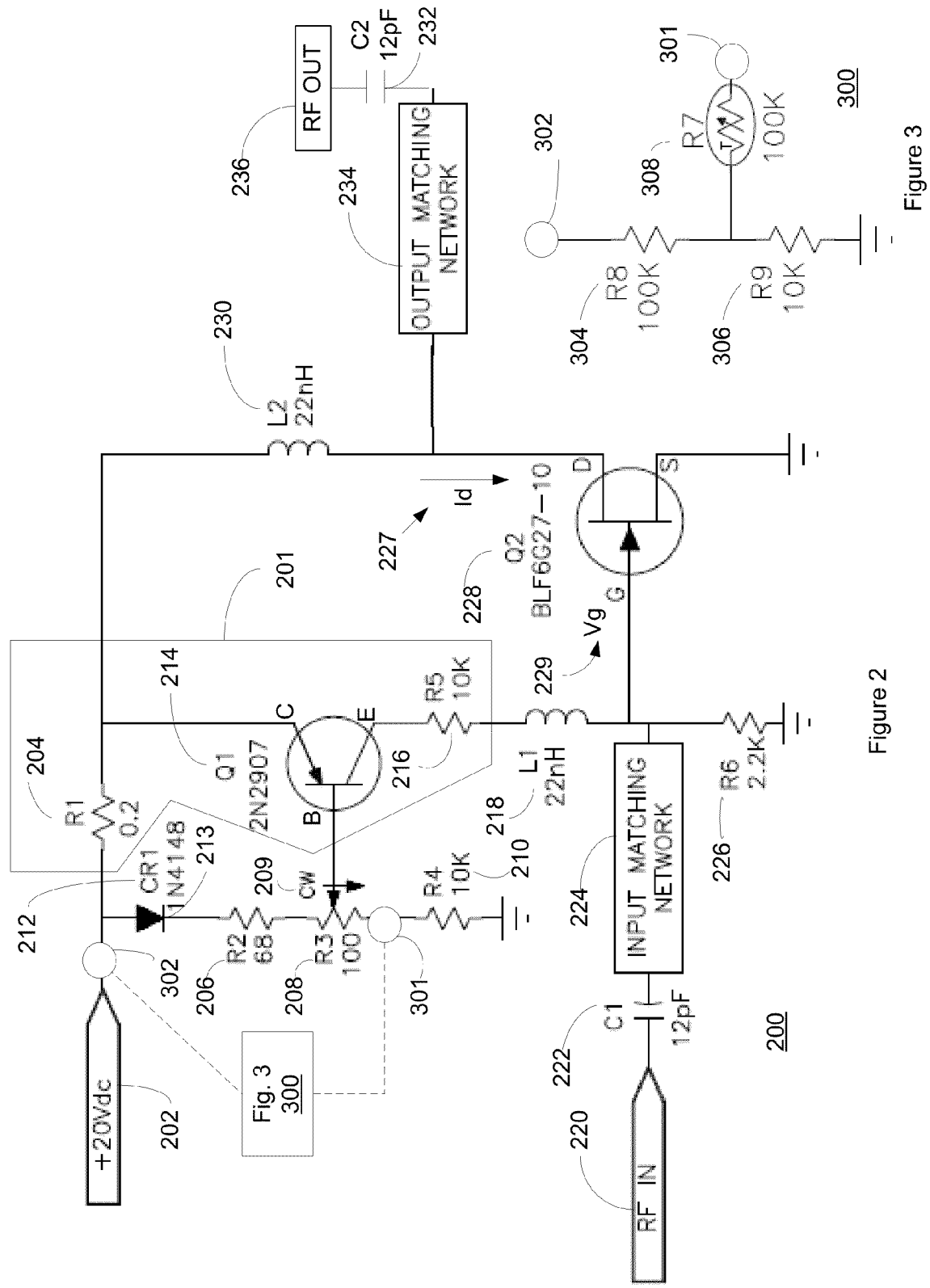

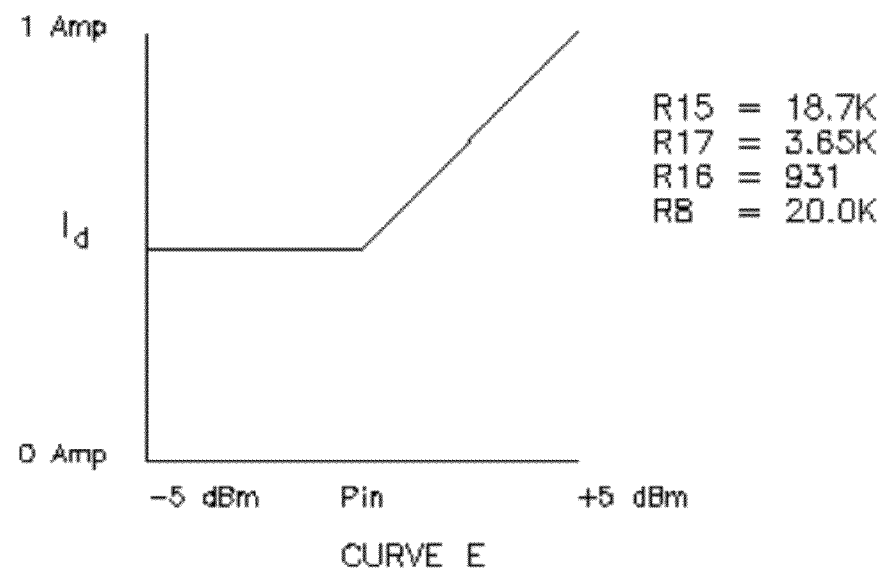
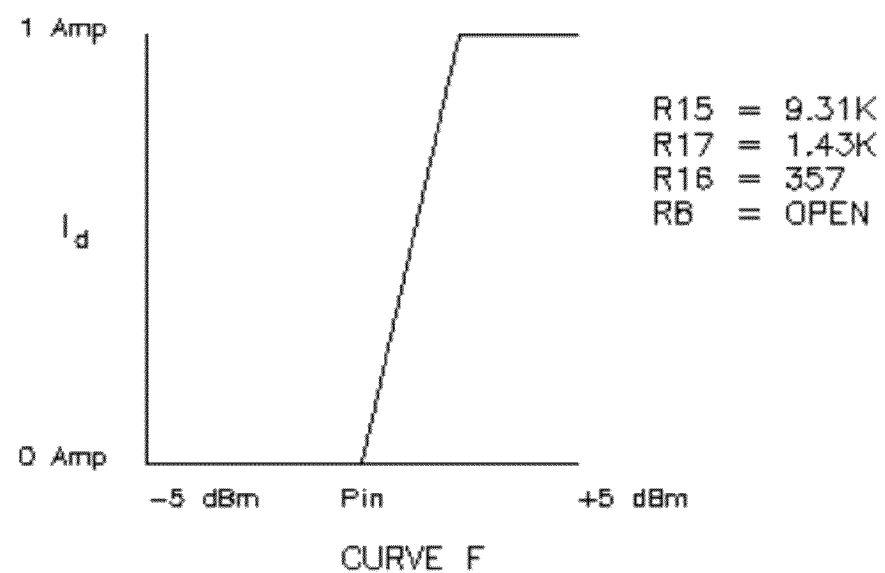
Figure 20B

METHOD AND SYSTEM FOR PROVIDING AUTOMATIC GATE BIAS AND BIAS SEQUENCING FOR FIELD EFFECT TRANSISTORS

CROSS-REFERENCE TO RELATED PATENT APPLICATIONS

This patent application claims priority to U.S. Provisional Patent Application No. 61/340,960, filed Mar. 25, 2010, entitled "METHOD AND SYSTEM FOR PROVIDING AUTOMATIC GATE BIAS FOR FIELD EFFECT TRANSISTORS," to U.S. Pat. No. 8,188,794, issued May 29, 2012, entitled "METHOD AND SYSTEM FOR PROVIDING AUTOMATIC GATE BIAS FOR FIELD EFFECT TRANSISTORS," and to U.S. patent application Ser. No. 13/481,906, filed May 28, 2012, entitled "METHOD AND SYSTEM FOR PROVIDING AUTOMATIC GATE BIAS FOR FIELD EFFECT TRANSISTORS," which application is to issue Jan. 7, 2014 as U.S. Pat. No. 8,624,675, as all of which are hereby incorporated by reference herein in their entirety.

FIELD OF THE INVENTION

The present invention relates generally to apparatus and method for amplifying radio frequency (RF) signals, including microwave RF signals. More particularly, the present invention pertains to a transistor gate bias circuit for RF amplifier applications to overcome device variations and changing operating conditions to control and maintain transistor drain current.

BACKGROUND OF THE INVENTION

The present invention provides an RF amplifier gate bias circuit that is appropriate for use in a wide range of frequencies and applications having no particular bounds and including KHz to GHz, including in the L, S, and C bands. The S band ranges from 2 to 4 GHz and is part of the microwave band of the electromagnetic spectrum used in weather radar, surface ship radar, and communications satellites applications. The L band, referred to as the IEEE L band, is a portion of the microwave band of the electromagnetic spectrum ranging from 1 to 2 GHz. The L band is used in communications, digital audio broadcast, satellite communications, telecommunications, military, telemetry as well as other applications. For instance, the Global Positioning System (GPS) utilizes carriers in the L band. Uses for IEEE C-band frequencies, which extend from 4 to 8 GHz, include satellite communications, weather radar, and military applications.

Laterally Diffused Field Effect Transistor (LDFET), also referred to as Laterally Diffused Metal-Oxide Semiconductor (LDMOS), type Radio Frequency (RF) devices have several advantages over bipolar transistors such as higher gain, higher efficiency, and wider dynamic range of output power. LDFETs also have a major disadvantage in that the gate bias voltage ($V_g$) required to set the quiescent current ($I_d$) drifts over temperature, time, input drive, and frequency, as well as from device to device variations. Considerable effort has been expended by the various manufacturers of these devices to lessen this undesirable effect, but no one has fully solved the problem.

Exemplary uses of the RF amplifier gate bias circuit of the present invention are transmission applications, including transmitters, receivers, and power amplifiers.

What is needed is a solution to address the various undesirable operational side effects associated with use of LDFET, GaNFET, GaAsFET, JFET and other such transistors to more fully and efficiently take advantage and utilize their beneficial properties and to expand the acceptable use of such devices in a wider range of RF applications.

In addition, N-Channel depletion device-based amplifiers operate with the negative characteristic of N-channel depletion mode devices that require a negative gate voltage and gate-drain bias sequencing for proper operation. With any N-Channel depletion device, such as GaAs FET, GaN FET, or N-channel silicon junction FET, it is essential that the negative gate voltage arrives before the drain voltage otherwise the drain to source resistance is a very low value which will essentially short out the input power and likely cause damage to several circuit components including the depletion device. Existing approaches to sequencing for GaN devices, e.g., test fixture set up for fire-up and shut-down sequencing, are cumbersome and are external to the device, e.g., amplifier. For example, supplying a negative voltage on a test fixture or lab bench is typically accomplished with an external supply having negative voltage generation capability or by switching the leads between the ground node and the positive voltage node. In an application circuit the negative voltage comes from a regulator or a negative voltage generator. The goal in bias sequencing the device is to avoid areas that are sensitive to potential instability of the device, e.g., the area where $V_{DS}$ drain to source is low and $I_{DS}$ drain to source is high. What is needed is an improved sequencer for use in RF amplifiers employing N-channel depletion mode devices that is internal to the amplifier circuit or device and that is flexible in accommodating a variety of such devices having differing attributes.

Applications for the invention include two-way private radio communication, broadband amplifiers, cellular infrastructure, test instrumentation, and Class A, AB, Linear amplifiers suitable for OFDM, W-CDMA, EDGE, CDMA waveforms.

As discussed above, temperature compensation is another aspect to circuit integrity and this has further relevance to bias sequencing and to adequately maintain the bias of the device for consistent performance over temperature. The quiescent current of a GaN HEMT device is primarily a function of temperature and $V_{GS}$. What is needed is a bias circuit with temperature compensation that can maintain consistent operational performance over a prescribed range of temperature fluctuation, e.g., −50 to 100 degrees Celsius.

SUMMARY OF THE INVENTION

The present invention is intended for many uses and applications including in design and manufacture of airborne and ground-based telemetry equipment, including aircraft (manned and unmanned), ground vehicles, fixed systems and military telemetry equipment. Telemetry system components include transmitters, receivers, and power amplifiers in a wide variety of frequency ranges. As in many areas, there is a growing need and desire for telemetry components that are low cost, low power consumption (for battery, heat and other concerns), light weight, low failure rate, less complex, compact, more robust and rugged design for harsh environments, and of course high performance. For instance, the RF amplifier gate bias circuit of the present invention may be incorporated in transmitters, receivers, and power amplifiers.

In one aspect, the invention provides a transistor gate bias circuit for RF amplifiers that senses drain current and automatically adjusts or biases the gate voltage to maintain drain current independently of temperature, time, input drive, frequency, as well as from device to device variations.

In another aspect of the invention a major advantage over prior art is that unlike conventional gain blocks, the supply current varies according to the output power required to maintain a constant gain.

In yet another aspect of the invention an advantage over prior circuits is that it does not attempt to minimize the spurious responses by better decoupling or improved grounding or any of the other known techniques. Rather, the circuit of the invention eliminates the problem entirely by shutting down the negative voltage deriving oscillator once it is no longer needed.

In a further aspect, the present invention provides an improved N-Channel depletion device-based amplifier with novel gate bias circuit and sequencer. With any N-Channel depletion device, such as GaAs FET, GaN FET, or N-channel silicon junction FET, it is essential that the negative gate voltage arrives before the drain voltage or the drain to source resistance is a very low value which will essentially short out the input power and likely cause damage to several circuit components including the depletion device. The present invention provides a novel sequencer for more effectively maintaining the necessary condition to prevent damage to amplifier components. The present invention may also provide an Adaptive Drain Current Control (ADCC). In a further aspect, an opto-coupler may be used in the circuit or in the alternative a battery or a Peltier Effect thermoelectric device.

In one embodiment, the present invention involves an RF amplifier circuit comprising: a FET for receiving a RF input signal and generating an amplified RF output signal, the FET having a gate, drain, and source; a control circuit, connected to the gate and drain of the FET, for controlling the current at the drain; and a bias circuit comprising a means for biasing and variably compensating drift in the gate threshold voltage required to set the quiescent drain current, the bias circuit being connected to the control circuit and controlling operation of the control circuit to maintain constant current at the drain at wake-up transition; whereby the output remains essentially constant relative to external temperature.

Further, the present invention may comprise temperature-sensing means, connected to the control circuit, for sensing change in temperature; and thermal compensation means, connected to the temperature-sensing means and control circuit, for automatically adjusting the drain current if the temperature decreases or increases to maintain essentially constant output with respect to temperature; whereby the control circuit maintains essentially constant current at the drain with respect to time, input drive, frequency, and device-to-device variations, but not temperature. The present invention may be adapted to provide essentially constant output power throughout operation, including wake-up transition and post-wake-up transition operation. The thermistor of the present invention may comprise both the temperature-sensing means and the thermal compensation means.

The present invention may also comprise: detecting means, connected to the RF input signal, for detecting the power level of the RF input signal and supplying a DC voltage representative of the detected power level; means for producing a variable reference voltage; comparing means, having an input for receiving the variable reference voltage and being connected to the detecting means, for comparing the supplied DC voltage to the variable reference voltage; and switching means, connected to the comparing means and the bias circuit, for turning off the LDFET if the input signal level is less than the variable reference voltage; wherein disposed intermediate of the RF input signal and the detecting means is one of a group consisting of a capacitor and a coupler.

Moreover, the present invention may further comprise: detecting means, connected to the RF output signal of the circuit, for detecting the level of the output signal and supplying a DC voltage representative of the detected output signal level; means for producing a variable reference voltage; and adjusting means, connected to the detecting means, the variable reference voltage and the bias circuit, for automatically increasing or decreasing the drain current if the supplied DC voltage is lower or higher (respectively) than the reference voltage to maintain essentially constant output RF power; wherein the disposed intermediate of the RF output signal and the detecting means is one of a group consisting of a capacitor and a coupler.

Additionally, the present invention may further comprise: a digital reference voltage generator adapted to produce and output a digital signal representing the reference voltage; and a digital-to-analog convertor having an input for receiving the digital signal, and an output connected to the adjusting means for supplying a computer-controllable analog reference voltage signal to the adjusting means.

The present invention may also further comprise: a first detecting means, connected to the RF input signal of the circuit, for detecting the power level of the input signal and supplying a DC voltage representative of the detected input signal level; and a second detecting means, connected to the RF output signal of the circuit, for detecting the level of the output signal and supplying a DC voltage representative of the detected output signal level; and an adjusting means, connected to the first detecting means, the second detecting means and the bias circuit, for automatically increasing or decreasing the drain current if the second supplied DC voltage is lower or higher (respectively) than the first supplied DC voltage by an amount necessary to maintain an essentially constant gain; wherein disposed intermediate of the RF input signal and the detecting means is one of a group consisting of a first capacitor and a first coupler, and wherein disposed intermediate of the RF output signal and the detecting means is one of a group consisting of a second capacitor and a second coupler.

Also, the present invention may further comprise: a digital attenuator, connected to the RF input signal and the first detecting means, for adjusting a gain of the circuit. In addition, the present invention may also involve comprising: means for producing a negative voltage signal; a voltage regulator having an input and an output, the input connected to the negative voltage producing means and the drain of the FET, the output connected to the gate of the FET, the voltage regulator adapted to supply a regulated negative voltage signal to the gate of the FET; and a shutdown means, connected to the negative voltage producing means, for shutting down the negative voltage producing means after a FET wake-up transition; and whereby the voltage regulator supplies a regulated negative voltage signal to the gate of the FET both during and after the FET wake-up transition; wherein the voltage regulator comprises: an inverting amplifier comprising an operational amplifier, the negative supply of the operational amplifier being connected to the negative voltage producing means and the drain of the FET; wherein the means for biasing and variably compensating drift comprises a variable resistance device; and wherein the FET is one of a group consisting of LDFET, GaNFET, GaAsFET, JFET, and MOSFET.

In yet another embodiment, the present invention provides an RF amplifier circuit comprising: a FET for receiving a RF input signal and generating an amplified RF output signal, the FET having a gate, drain, and source; a control circuit, connected to the gate and drain of the FET, for controlling the current at the drain; a dividing circuit comprising a means for biasing and variably compensating drift in the gate threshold voltage required to set the quiescent drain current, the dividing circuit being connected to the control circuit and controlling operation of the control circuit to maintain an essentially constant current at the drain in connection with a wake-up transition; a detecting means, operably connected to the RF output signal, for detecting the power level of the RF output signal and supplying a DC voltage representative of the detected output power level; a means for producing a variable reference voltage; and an adjusting means, connected to the detecting means, the variable reference voltage and the dividing circuit, for automatically adjusting the drain current based at least in part on a comparison of the supplied DC voltage and the reference voltage by an amount necessary to maintain essentially constant output RF power.

Also the present invention may further comprise: a small value capacitor, operably connected to the RF output signal and the detecting means. In addition, the present invention may also involve comprising: wherein the reference voltage is a digital computer-controlled reference voltage input, and further comprising a digital-to-analog convertor operably connected to the digital input and the adjusting means and adapted to supply a computer-controllable analog reference voltage signal to the adjusting means.

In yet another embodiment, the present invention provides a method comprising: receiving by a FET a RF input signal and generating an amplified RF output signal, the FET having a gate, drain, and source; controlling the current at the drain by biasing and variably compensating drift in the gate threshold voltage required to set the quiescent drain current to maintain an essentially constant current at the drain in connection with a wake-up transition; and based at least in part on temperature change, automatically altering the drain current to maintain essentially constant output power with respect to temperature; maintaining essentially constant drain current with respect to time, input drive, frequency, and device-to-device variations, while allowing a change in drain current with respect to temperature variations.

In yet another embodiment, the present invention provides an RF amplifier circuit comprising: a FET for receiving a RF input signal and generating an amplified RF output signal, the FET having a gate, drain, and source; a control circuit, connected to the gate and drain of the FET, for controlling the current at the drain; a bias circuit comprising a means for biasing and variably compensating drift in the gate threshold voltage required to set the quiescent drain current, the bias circuit being connected to the control circuit and controlling operation of the control circuit to maintain an essentially constant current at the drain; a deriving means for deriving a negative voltage signal; and a regulating means having an input and an output, and operably connected at the input to the deriving means and operably connected at the output to the gate of the FET, and supplying a regulated negative voltage signal to the gate of the FET, whereby the regulating means supplies a regulated negative voltage signal to the gate of the FET. Additional features of the invention may include: a shutdown means, connected to the deriving means, for shutting down the deriving means after a start-up mode of the amplifier; or the regulating means may comprise an inverting amplifier comprising an operational amplifier, the negative supply of the operational amplifier being connected to the deriving means and the drain of the FET; or the deriving means comprises either an optically coupled negative generator or an oscillator negative generator; or the FET is an N-Channel depletion mode device; or a bias sequencer adapted to maintain the FET in pinch-off condition before the drain voltage is applied to avoid the FET acting as a short circuit; or the bias sequencer comprises a low drop out voltage regulator; or the bias sequencer comprises a P-channel MOSFET; or an adaptive current control circuit adapted to measure input RF power and to output a signal representing the input RF power, whereby during operation of the RF amplifier circuit an increase in input RF power causes the drain current of the FET to increase and a decrease in input RF power causes the drain current of the FET to decrease; or an adaptive current control circuit adapted to receive a signal representing output RF power, whereby during operation of the RF amplifier circuit an increase in output RF power causes the drain current of the FET to increase and a decrease in output RF power causes the drain current of the FET to decrease; or a means for switching on and off the drain current of the FET, whereby drain current is permitted only when input RF power is sensed. Further, the circuit may comprise: detecting means, operably connected to the RF input signal, for detecting the power level of the RF input signal and supplying a DC voltage representative of the detected power level; means for producing a variable reference voltage; comparing means, operably connected to the detecting means and the variable reference voltage, for comparing the supplied DC voltage to the variable reference voltage; and means, operably connected to the comparing means, for further controlling operation of the FET based at least in part on a comparison of the supplied DC voltage and the variable reference voltage. The circuit may further comprise: a first detecting means, operably connected to the RF input signal, for detecting the power level of the RF input signal and supplying a first DC voltage representative of the detected input power level; a second detecting means, operably connected to the RF output signal of the circuit, for detecting the power level of the RF output signal and supplying a second DC voltage representative of the detected output power level; and an adjusting means, connected to the first detecting means, the second detecting means and the bias circuit, for automatically adjusting the drain current based at least in part on a comparison of the second supplied DC voltage and the first supplied DC voltage by an amount necessary to maintain an essentially constant gain. The circuit may further comprise: detecting means, operably connected to the RF output signal of the circuit, for detecting the power level of the RF output signal and supplying a second DC voltage representative of the detected output power level; and means for producing a variable reference voltage; adjusting means, connected to the detecting means, the variable reference voltage means and the bias circuit, for automatically adjusting the drain current based at least in part on a comparison of the supplied DC voltage and the reference voltage to maintain an essentially constant output RF power.

A further embodiment of the invention provides an RF amplifier circuit comprising: an N-Channel depletion mode FET for receiving a RF input signal and generating an amplified RF output signal, the FET having a gate, drain, and source; a control circuit, connected to the gate and drain of the FET, for controlling the current at the drain; a bias circuit comprising a means for biasing and variably compensating drift in the gate threshold voltage required to set the quiescent drain current, the bias circuit being connected to the control circuit and controlling operation of the control circuit to maintain an essentially constant current at the drain; a means for supplying a regulated negative voltage signal to the gate of the FET; and a bias sequencer adapted to maintain the FET in pinch-off condition before a drain voltage is applied to avoid the FET acting as a short circuit.

BRIEF DESCRIPTION OF THE DRAWINGS

In order to facilitate a full understanding of the present invention, reference is now made to the accompanying drawings, in which like elements are referenced with like numerals. These drawings should not be construed as limiting the present invention, but are intended to be exemplary and for reference.

FIG. 2 is a schematic of a first embodiment of a LDFET amplifier of the present invention with the automatic gate bias circuit;

FIG. 3 is a schematic of an optional temperature compensation circuit for use with the amplifier of FIG. 2;

FIG. 13C is an alternative transistor base input circuit for the circuit of FIG. 13B;

FIGS. 20A-B are illustrations of a series of curves A-F related to operation of the present invention.

DETAILED DESCRIPTION OF THE PREFERRED EMBODIMENT

The present invention will now be described in more detail with reference to exemplary embodiments as shown in the accompanying drawings. While the present invention is described herein with reference to the exemplary embodiments, it should be understood that the present invention is not limited to such exemplary embodiments. Those possessing ordinary skill in the art and having access to the teachings herein will recognize additional implementations, modifications, and embodiments, as well as other applications for use of the invention, which are fully contemplated herein as within the scope of the present invention as disclosed and claimed herein, and with respect to which the present invention could be of significant utility.

The following exemplary circuits contain values which are typical for operation at +20 VDC and in the 2 to 3 GHz band and help explain the inventive contribution in terms of performance. Although the invention may be described in examples in the GHz range, it should be understood that the invention has broad application in RF applications including in the KHz range. LDFETs generally have application up to 3 GHz while GaAs and GaN FETs typically have application up to 20-30 GHz. Although particular parts and values are shown, these are by way of example to help explain the invention and are not to be considered limiting to the invention.

Figure 1:
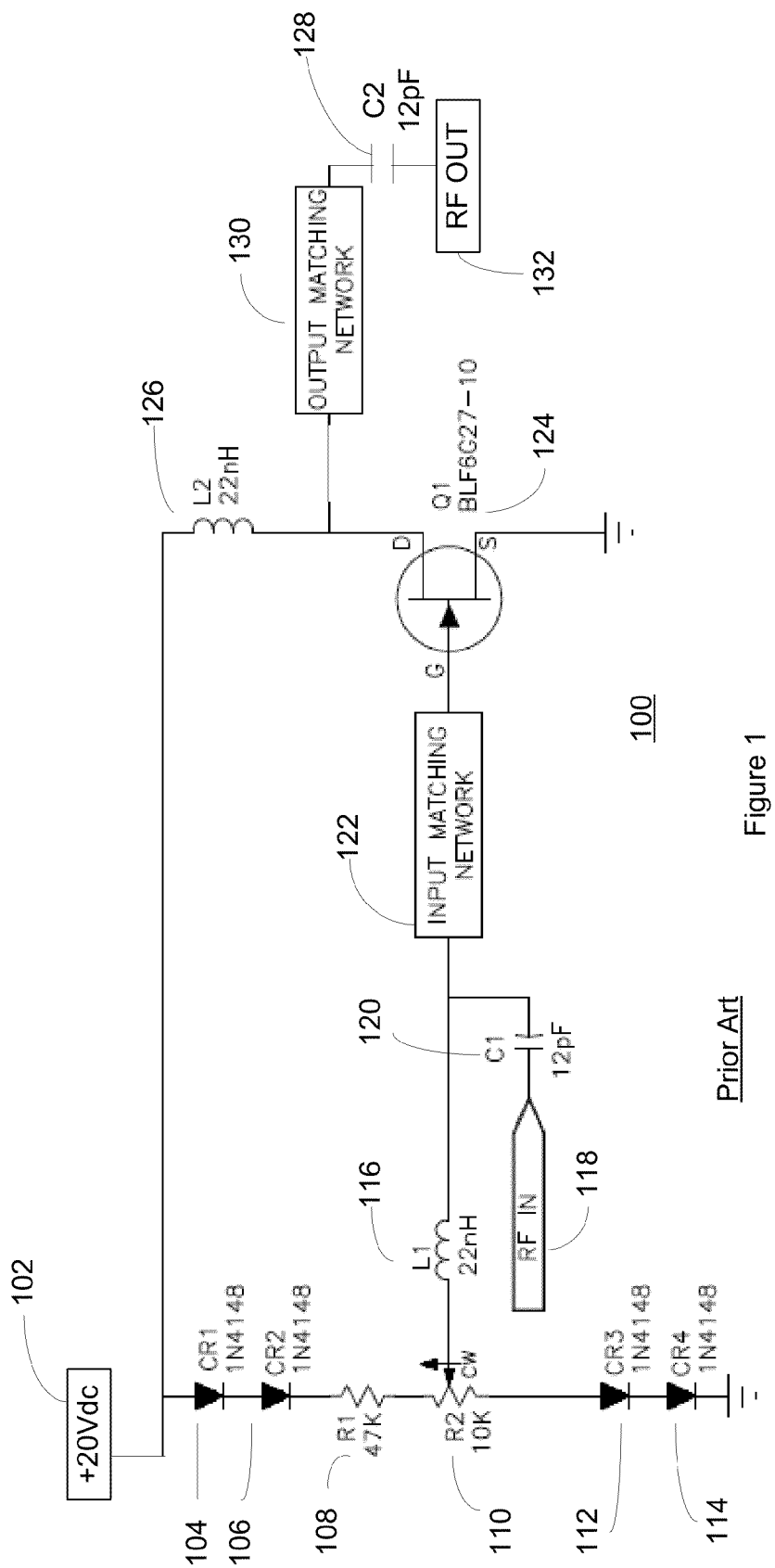
FIG. 1 is a schematic of a prior art LDFET-based Radio Frequency (RF) amplifier.

FIG. 1 illustrates a prior art Radio Frequency (RF) Amplifier 100 having a supply voltage of +20 Vdc 102 and which receives an RF signal input 118 and outputs an amplified RF signal 132. Input Matching Network 122, which can include capacitors, inductors, resistors, and transmission lines, is designed to provide required impedance matching, harmonic attenuation, bandwidth and other operating characteristics for use at operating frequencies of circuit 100 and in particular in matching the power transistor Q1. This matching circuit may be calculated using mathematical models and simulation programs. In the circuit of FIG. 1 the gate of RF power transistor Q1 124 is biased by adjusting the potentiometer R2 110 to cause the desired quiescent drain current to flow. In this example, Q1 124 is a 10 Watt LDMOS (Laterally Diffused Metal-Oxide Semiconductor) power transistor for applications at frequencies between 2.5 and 2.7 GHz. For example, Q1 124 may be part number BLF6G27-10 supplied by NXP Semiconductors. In this example, diodes 104, 106,112, 114 (CR1-4) are part number 1N4148 of NXP Semiconductors. By adding or removing diodes 104, 106, 112, 114 (CR1-4) in series with resistors 108 and 110 (R1 and R2), the gate voltage can be made to increase or decrease as a function of temperature, thereby compensating the drift of the gate threshold voltage with respect to temperature on an open loop basis. Determining the proper temperature compensation for each device requires several temperature cycles of up to four hours each. This is obviously a time-consuming procedure tying up expensive test equipment as well as an RF technician for many hours per amplifier. Moreover, in the end this does nothing to solve the other aspects of the gate drift problem.

The amplifier 200 of FIG. 2 solves the gate drift problem by providing a drain current or gate bias control circuit 201, including drain current sensing resistor R1 204, that senses the drain current Id 227 of Q2 228 and automatically adjusts the gate voltage Vg 229 to maintain drain current Id 227 independently of temperature, time, input drive, frequency, as well as from device to device variations. Q2 228, like Q1 124 of FIG. 1 above, is in this example a 10 W LDMOS or LDFET power transistor. With the circuit as shown, adjusting the potentiometer R3 208 from end to end will cause the drain current Id 227 to vary from 650 mA to 1.60 A and, once set, Id 227 will then remain essentially constant with respect to the above parameters. In this manner, a user may increase of decrease the setting of drain current Id 227 by adjusting the potentiometer R3. Assume a supply voltage of +20.0 VDC 202 and a forward drop over diode CR1 212 of 0.70 VDC. The cathode 213 of diode 212 will then be at a potential of 19.30 VDC. The purpose of diode 212 is to temperature compensate the base (B) to emitter (E) voltage (Vbe) of Q1 214. In this example, Q1 214 has part number 2N2907 of NXP Semiconductors, also known as PN2907, and is a bipolar transistor intended for low power amplifying or switching applications. The wiper 209 of potentiometer R3 208, which is connected to the base of Q1 214, will then allow adjustment from +18.98 VDC to +19.17 VDC. With the wiper 209 of potentiometer 208 centered, the base will be at +19.07 VDC. Assuming a Vbe of Q1 of 0.70 VDC, the emitter of Q1 will then be at +19.77 VDC. For Q1 emitter to be at +19.77 VDC, the drain of Q2 must draw 1.15 A (1.15 A×0.2 ohms=0.23 VDC=20 VDC−19.77 VDC). For this to happen, a current of approximately 1 mA must and will flow from the collector (C) of Q1 to develop sufficient voltage across resistor R6 226 to bring the gate of Q2 228 up to the voltage required to cause 1.15 Amps, Id 227, to flow through its drain.

Should Q2 228 attempt to draw more current, the base to emitter voltage (Vbe) of Q1 214 will be lowered, causing less current to flow to R6 226, causing the gate voltage to lower, thereby lowering the drain current Id 227 of Q2. The opposite is true should Q2 attempt to draw less drain current.

Inductors L1 218 and L2 230 act as RF chokes preventing RF power from reaching the collector of Q1 214 or the supply voltage 202. Capacitors C1 222 and C2 232 isolate the gate (G) and drain (D) of Q2 228 from a DC standpoint from the input and output matching circuitry, 224 and 234 respectively. Resistor R5 216 acting in concert with resistor R6 226 forms a voltage divider which prevents the collector (C) of Q1 214 from supplying excessive gate voltage to Q2 during "wake up." This initial "wake-up" transition or period may be in the context of the transistor operation or the overall circuit operation and may occur at initial start-up and/or at other periods during operation of the circuit or a circuit or system in which the amplifier is used. For instance, the overall circuit may be turned off or go into a "sleep" or "stand-by" mode of operation in power management to conserve energy and extend lifespan. The "wake-up" aspect of operation of either a transistor or a circuit is known by those skilled in the art of amplifier design and use.

FIG. 3 represents an optional thermal or temperature compensation circuit 300 for incorporation into the circuit of FIG. 2 as shown at connection nodes 301 and 302. The exemplary circuit of FIG. 3 includes two resistors 304 and 306 (R8, R9) and a thermistor 308 (R7) that are added to provide the opportunity to intentionally change the drain current Id 227 of Q2 228 as a function of temperature. It is often desirable to increase the drain current Id 227 as the temperature increases in order to maintain a constant output power. With the values shown, and the ambient current set to 1.15 Amps, this would increase to approximately 1.50 Amps at +70C. However, when the drain current is allowed to change according to temperature, the function of the control circuit varies slightly. Whereas in FIG. 2 the control circuit's function is to draw a constant current at the drain, its function in FIG. 3 is to draw a constant current at the drain with respect to all parameters except for temperature. By allowing the drain current Id to vary according to temperature, a constant output can be maintained within a range of different temperatures. This advantage is not achieved in the first embodiment of the invention. In the example of FIG. 2, the gate bias control circuit 201 senses the drain current Id 227 of Q2 228 and automatically adjusts the gate voltage Vg 229 to maintain drain current Id 227 independently of temperature, time, input drive, frequency, as well as from device to device variations. Adjusting the potentiometer R3 208 causes the drain current Id 227 to vary from, e.g., 650 mA to 1.60 A and, once set, Id 227 will remain essentially constant. The temperature compensation circuit of FIG. 3 is used to introduce a change to separately adjust and manipulate operation of transistor Q1 214 to manipulate the gate voltage of LDFET Q2 228 so as to force more or less current to flow across the drain current sense resistor R1 204. This may be particularly useful in over-temperature situations when it is desirable to have greater current flowing during "hot" operation.

Figure 4:
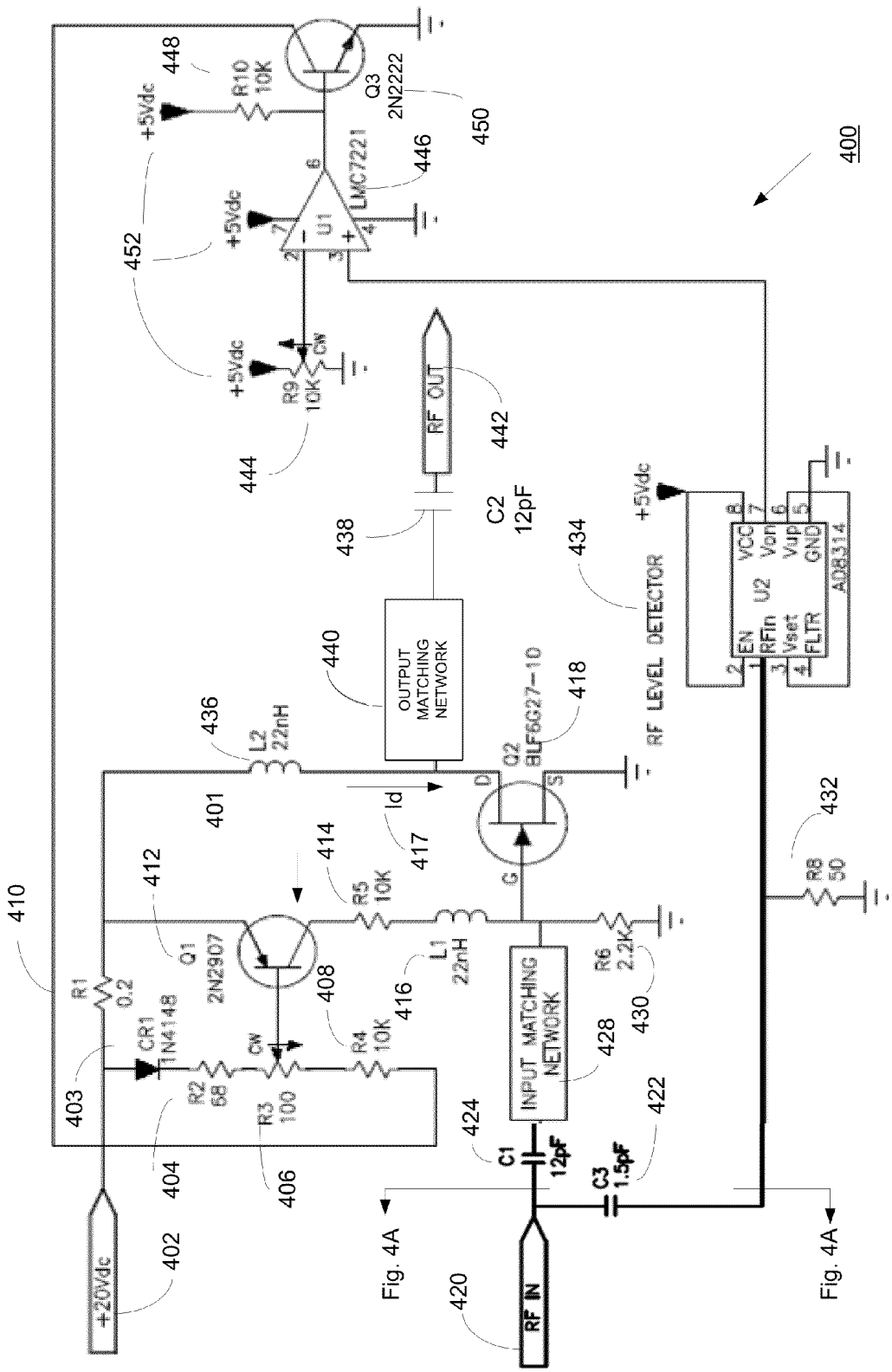
FIG. 4 is a variation of the amplifier of FIG. 2 having an RF power monitoring and drain current control circuit.

Although improved, the circuits of FIGS. 2 and 3 suffer the disadvantage of drawing the same drain current Id 227 whether or not there is any input RF power 220 present. To solve this disadvantage, the amplifier 400 of FIG. 4 includes an RF Level Detector, U2 434, which senses the input RF power 420 and presents a corresponding DC voltage to an input of a comparator, U1 446, which serves to turn on or shut off transistor Q2 based on a threshold reference voltage. In this manner amplifier 400 avoids unnecessary current flow and resulting undesired effects. RF Level Detector U2 434, in this example, is part number AD8314 as supplied by Analog Devices, Inc. and is a 50 dB dynamic range amplifier/conditioner used for transmitter power control and other applications. RF Level Detector U2 434 operates in the frequency range of 0.1 to 2.5 GHz and over a typical dynamic range of 50 dB. U2 434 is internally AC-coupled and has high sensitivity for control at low signal levels.

Figure 4A:
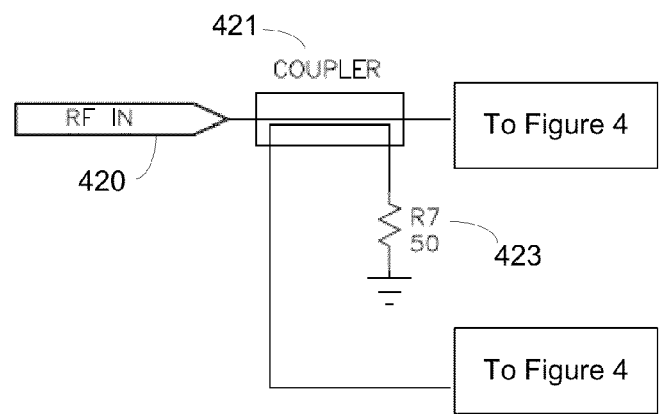
FIG. 4A is an alternative RF Input coupler arrangement for use in the circuit of FIG. 4.

RF IN 420 is connected to amplifier circuit 400 through capacitor C1 424 (e.g., 12 pF) to input matching network 428 and through capacitor C3 422 (e.g., 1.5 pF) to RFIn input of RF Level Detector 434. This simplified arrangement is particularly useful in narrow band applications. In one alternative, shown in FIG. 4A, RF IN 420 is connected to circuit 400 through coupler 421, which taps off some of the power flowing in the main RF path for use in a lower power path such as to drive a pre-scaler or in this case a level detector 434. Note that for narrow band applications the simplified arrangement of FIG. 4, small value capacitor rather than coupler of FIG. 4A, has the advantage of significantly reducing board space particularly as the operating frequency is reduced. For example at 2 GHz and a dielectric constant of 3.5 and a board thickness of 20 mils, the coupler trace would be approximately 0.860" in length and 0.140" in width. At 400 MHz, the trace length would increase to 4.30" with the same width. By comparison a 0402 capacitor occupies an area of 0.04"×0.02". The disadvantage of the simplified capacitor arrangement is that the amount of coupled energy becomes a function of frequency—$Zc=1/(2\pi \times F \times C)$. Since the F term (frequency) is in the denominator, the Zc decreases as frequency increases thereby increasing the coupled energy. With consideration of this trade-off, either arrangement may be used in the circuits of FIGS. 4-13.

By way of coupler 422 (FIG. 4A), such as physical traces on a circuit board, or through capacitor C3 422 (FIG. 4) a portion of the RF power is connected to input 1 (RFin) of U2 434 which acts as an RF level detector and presents a corresponding DC voltage to the input 3 of comparator U1 446, for example a micro-power CMOS comparator available from National Semiconductor by part number LMC7221. Both U1 446 and U2 434 are connected to a reference voltage +5 Vdc 452. The input 2 of the comparator U1 446 connects to potentiometer R9 444 which is adjusted to the desired input threshold RF power. Below this threshold the circuit draws only the current that is required by U1 446 and U2 434. Above the threshold the circuit performs essentially as the circuit of FIG. 2. The output 6 of U1 446 is connected to the base of transistor Q3 450, a general purpose transistor having part number 2N2222 or PN2222. The collector of Q3 450 is connected through resistor R4 408 to the potentiometer R3 406 which is connected to the base of bipolar transistor 412, which is part of drain current control circuit 401, similar to drain current control circuit 201 discussed above. In this manner, the combination of U1 446 and transistor Q3 450 control the base (B) to emitter (E) voltage (Vbe) of transistor Q1 412 below the set threshold so as to shut off the flow from the collector of Q1 412. This removes the voltage across resistor R6 430 thereby shutting off the drain current, Id 417, in Q2 418.

Figure 5:
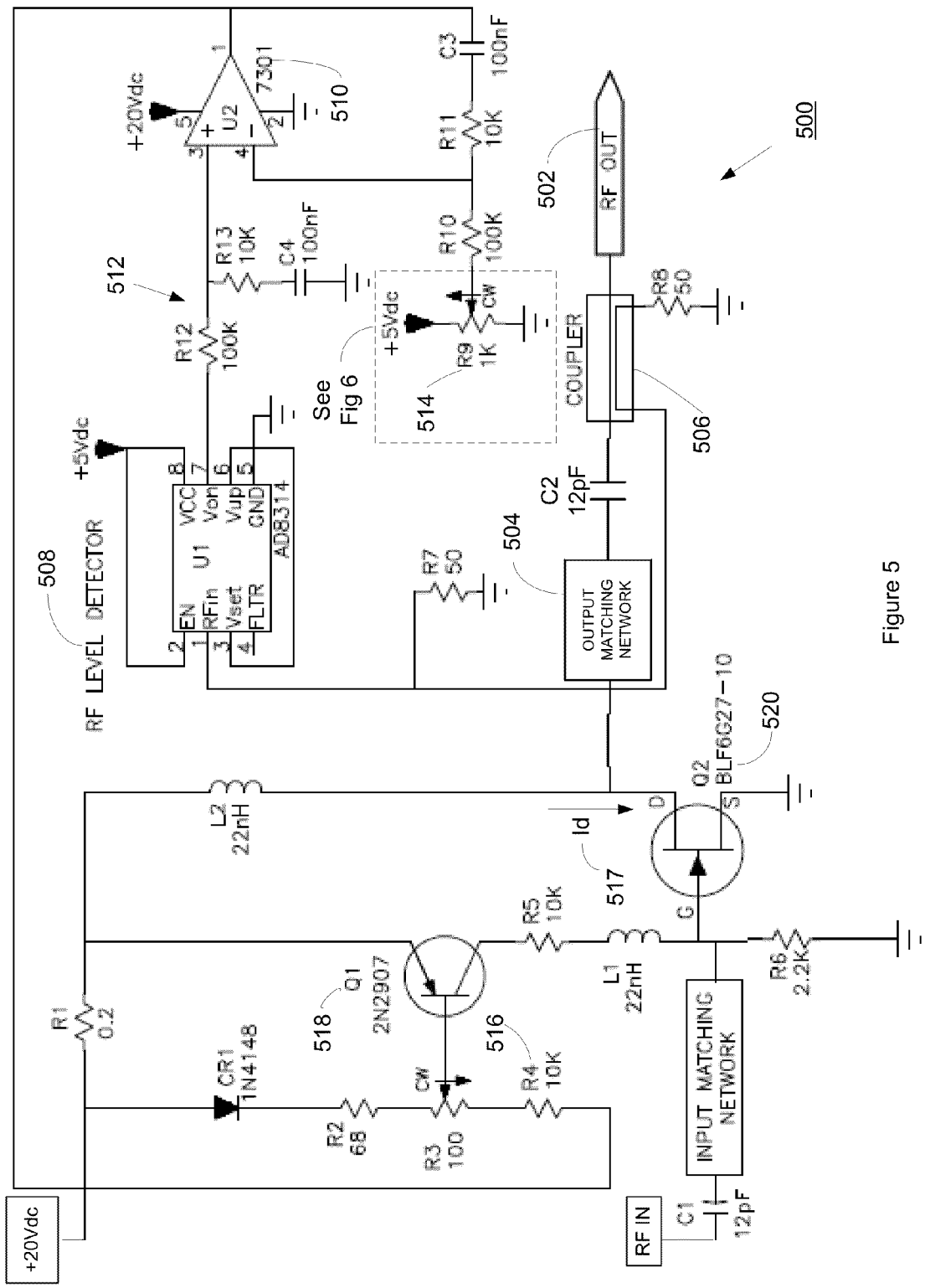
FIG. 5 is a variation of the amplifier of FIG. 2 having an RF output power leveling circuit.

The amplifier 500 of FIG. 5 includes an RF power leveling aspect. In operation, the output RF power 502 is output from Output Matching Network 504 through coupler 506, which is connected via input 1 (RFin) of integrator U1 508. In this manner, U1 508 senses the RF OUT and outputs at output 7 (Von) a corresponding DC voltage which is delivered to input 3 of integrator U2 510 by way of circuit 512. U2 510 in this example is a low power operational amplifier having part number LM 7301 as provided by National Semiconductor Corporation. By comparing this voltage with a preset voltage from potentiometer R9 514 the output of the integrator U2 510 will increase or decrease the voltage to resistor R4 516 to control operation of transistor Q1 518 so as to cause the drain current Id 517 associated with transistor Q2 520 to increase or decrease as required to maintain an essentially constant output RF power 502.

Figure 6:
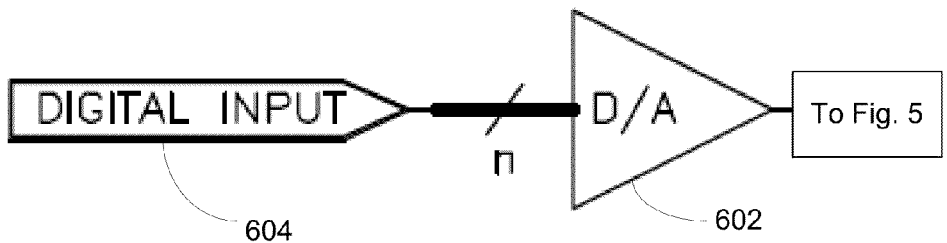
FIG. 6 is an optional digital input circuit for use with the RF output power leveling circuit in the amplifier of FIG. 5.

The circuit of FIG. 6 is an optional substitute circuit for use in the circuit of FIG. 5. FIG. 6 shows a digital to analog convertor 602 that is used in place of R9 514 thereby permitting the RF output power to be controlled by a computer command.

Figure 7:
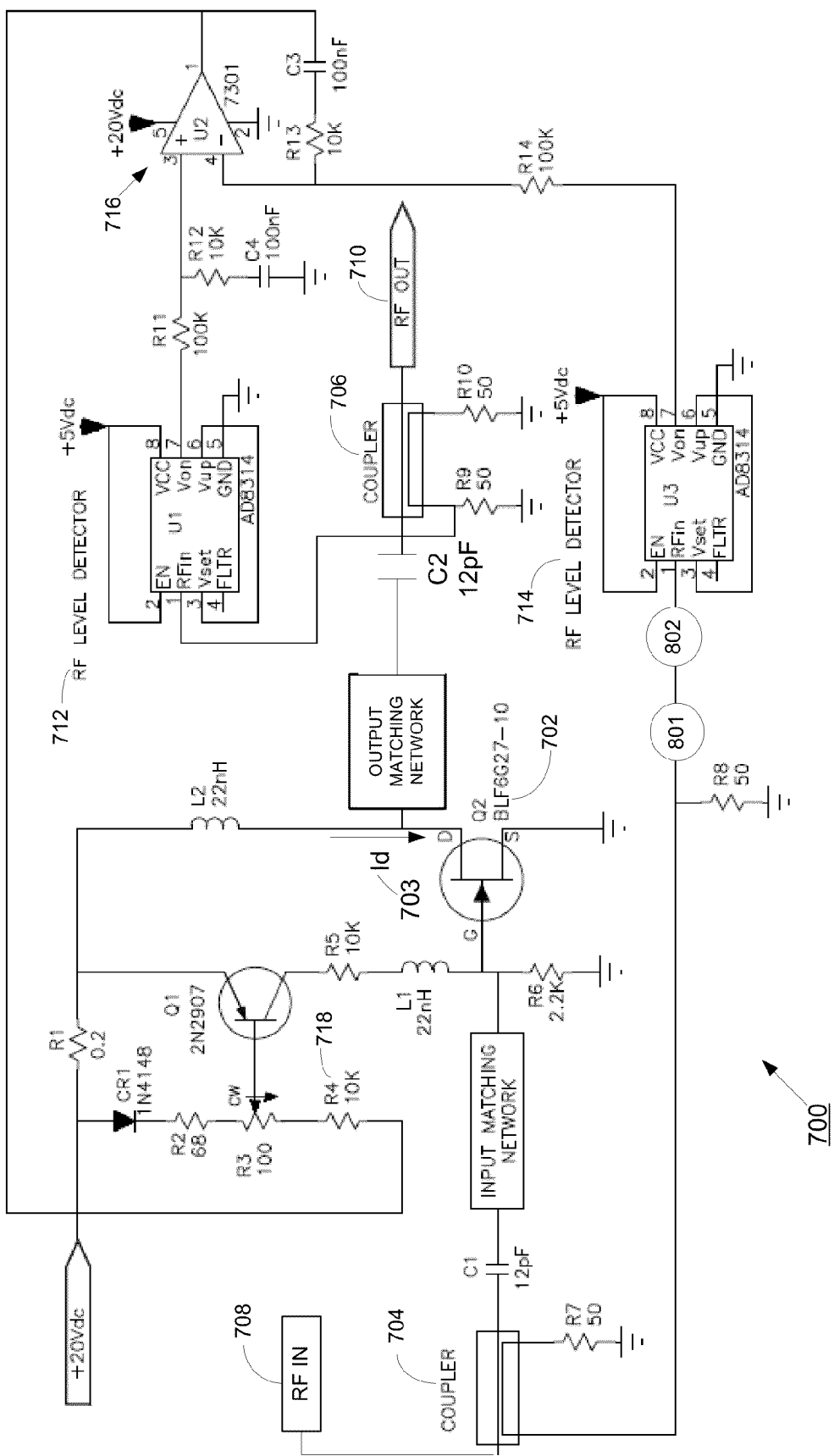
FIG. 7 is a variation of the amplifier of FIG. 2 having high power gain block configuration.

FIG. 7 illustrates an alternative amplifier 700 in which transistor Q2 702 operates as a high power gain block—the gain being determined by the ratio of the coupling coefficients of the output to input couplers 704/706. The input and output RF levels 708/710 are measured by RF Level Detectors U3 714 and U1 712 respectively. The outputs Von of RF Level Detectors U1 712 and U3 714 are delivered, respectively, to inputs 3 and 4 of integrator U2 716. The output 1 of U2 will in turn increase or decrease the voltage to resistor R4 718 causing the drain current Id 703 to increase or decrease as required cause the correct amount of current to flow through Q2 702 to cause the two inputs to equalize and maintain a constant output RF power.

If, for example, the input and output couplers 704/706 have coupling coefficients of 10 dB and 15 dB respectively, the overall circuit will exhibit a gain of 5 dB. One major advantage of this design over prior designs is that unlike conventional gain blocks, the drain current Id 703 varies according to the output power required to maintain a constant gain.

Figure 8:
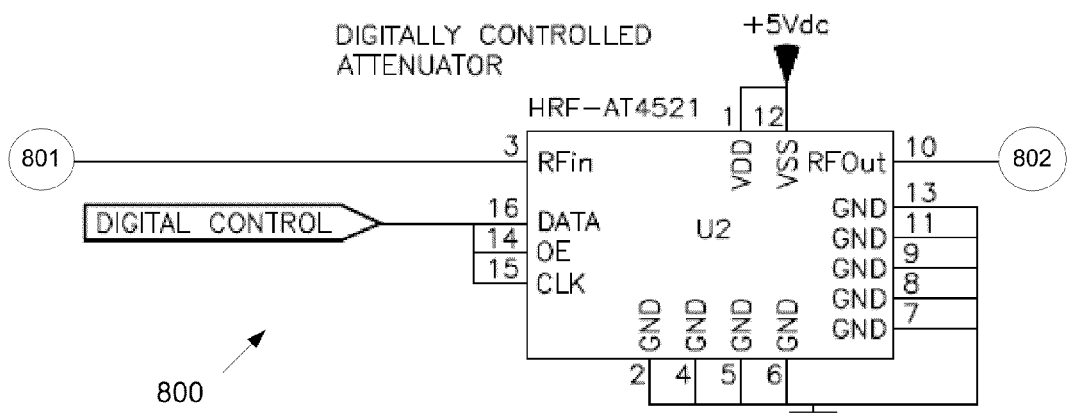
FIG. 8 is an optional digital attenuator for digital control for use with the high gain block variation of FIG. 7.

FIG. 8 is a schematic of an optional digital attenuator 800 placed in the input 1 (RFin) of the input power detector 714 of FIG. 7 as indicated at nodes 801 and 802. With the optional digital attenuator, amplifier 700 still performs as a gain block but with the added feature of selectable gain and also retains the advantage of drawing only that current Id 703 required to maintain the desired gain. While the gain is based in part on the coupling coefficients of couplers 704 and 706, the digital attenuator allows for programmable or selectable gain to adjust the actual gain achieved. In this example, attenuator 800 is part number HRF-AT4521 as made by Honeywell International Inc. and is a 31.0 dB, DC −2.5 GHz, DC-coupled, 50 ohm impedance 5 Bit Serial Digital Attenuator. In operation, a serial digital word such as received from a system control unit, is input to a register contained within this attenuator. This stored digital word then sets the attenuation ratio until a new word is received or DC power is cycled.

Figure 9:
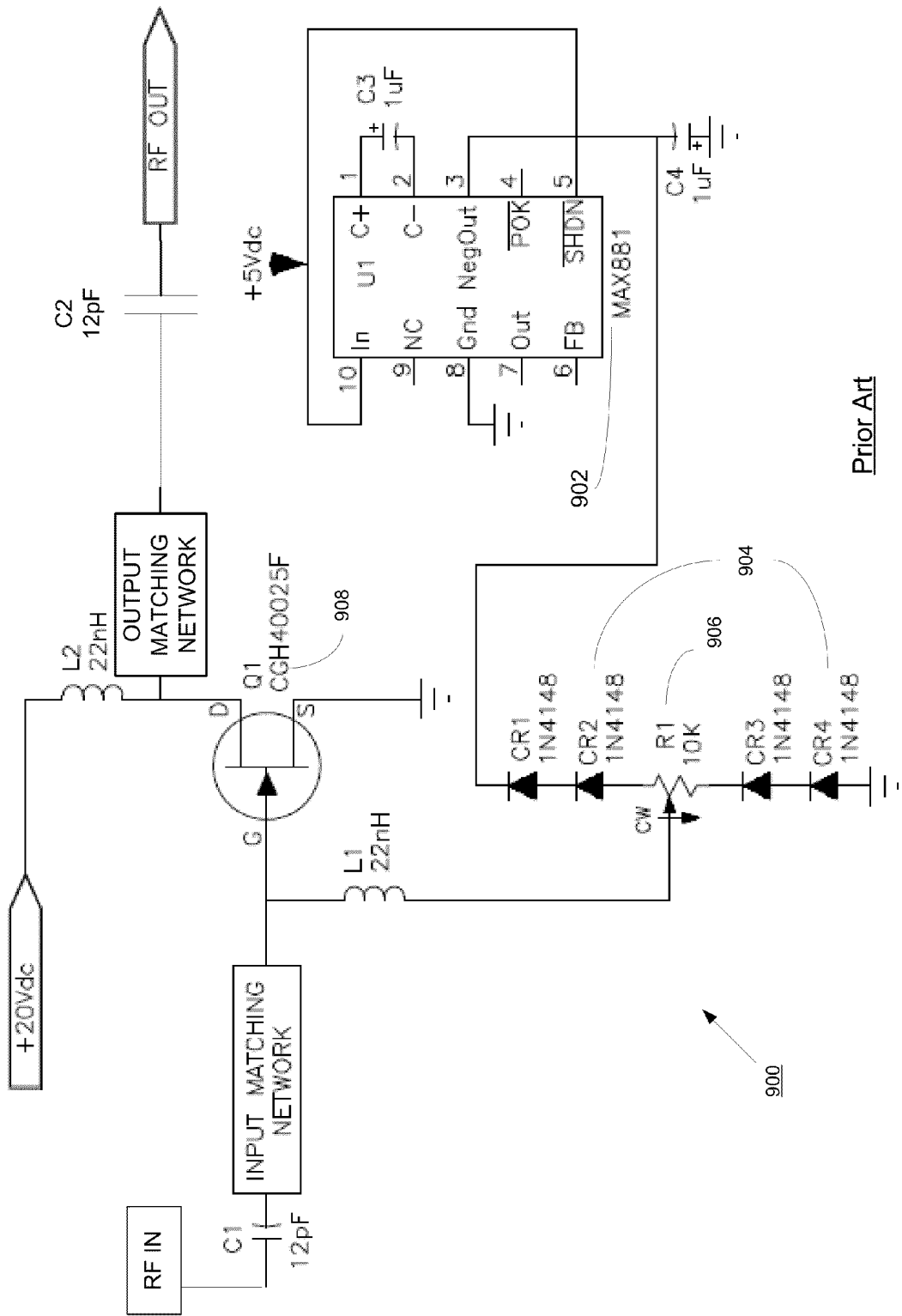
FIG. 9 is a schematic of a prior art GaNFET-based amplifier.

With reference to FIG. 9, a recent transistor technology is that of Gallium Nitride Field Effect Transistor (GaNFET), such as transistor Q1 902, which has among its advantages higher operating voltage, higher temperature operation, higher efficiency, and higher frequency operation than LDFETs. Both the GaNFET Q1 of FIG. 9 and the LDFET Q2 of FIG. 2 are positive sense with respect to the gate voltage in that a more positive (or less negative in the case of GaNFET) voltage on the gate results in higher drain current. While a typical gate voltage on a LDFET may be in the +1 to +2 VDC range, the gate on a GaNFET will normally operate in the −2 to −1 VDC range. This applies equally to GaAs FETs and JFETS for that matter. GaNFET transistors have similar gate drift problems as LDFETs, but as stated above they have the further complication of a negative gate voltage requirement. In many situations, such as in airborne applications, it is unusual to have a negative voltage available. To satisfy the negative voltage requirement, prior circuits such as FIG. 9 used a negative voltage driver IC such as the Maxim Semiconductor MAX881 (U1) 902. The output 3 (NegOut) of this device is presented to diodes CR1-4 904 and potentiometer R1 906 connected in series. Much like the LDFET prior art as discussed above, prior GaNFET transistor circuits used a similar approach of adding or removing diodes to accomplish temperature compensation for the threshold voltage on an open loop basis. Again, one problem with this solution is that the temperature compensation procedure is very labor and equipment intensive. Another problem is that U1 902 includes a square wave oscillator which causes spurious responses on the output of GaNFET power transistor Q1 908. In this example Q1 908 is a 25 W, RF Power GaNFET with part number CGH40025F as manufactured by Cree, Inc. There are many such devices available along with publicly available application notes expressing techniques concerning how to minimize such spurs.

Figure 10A:
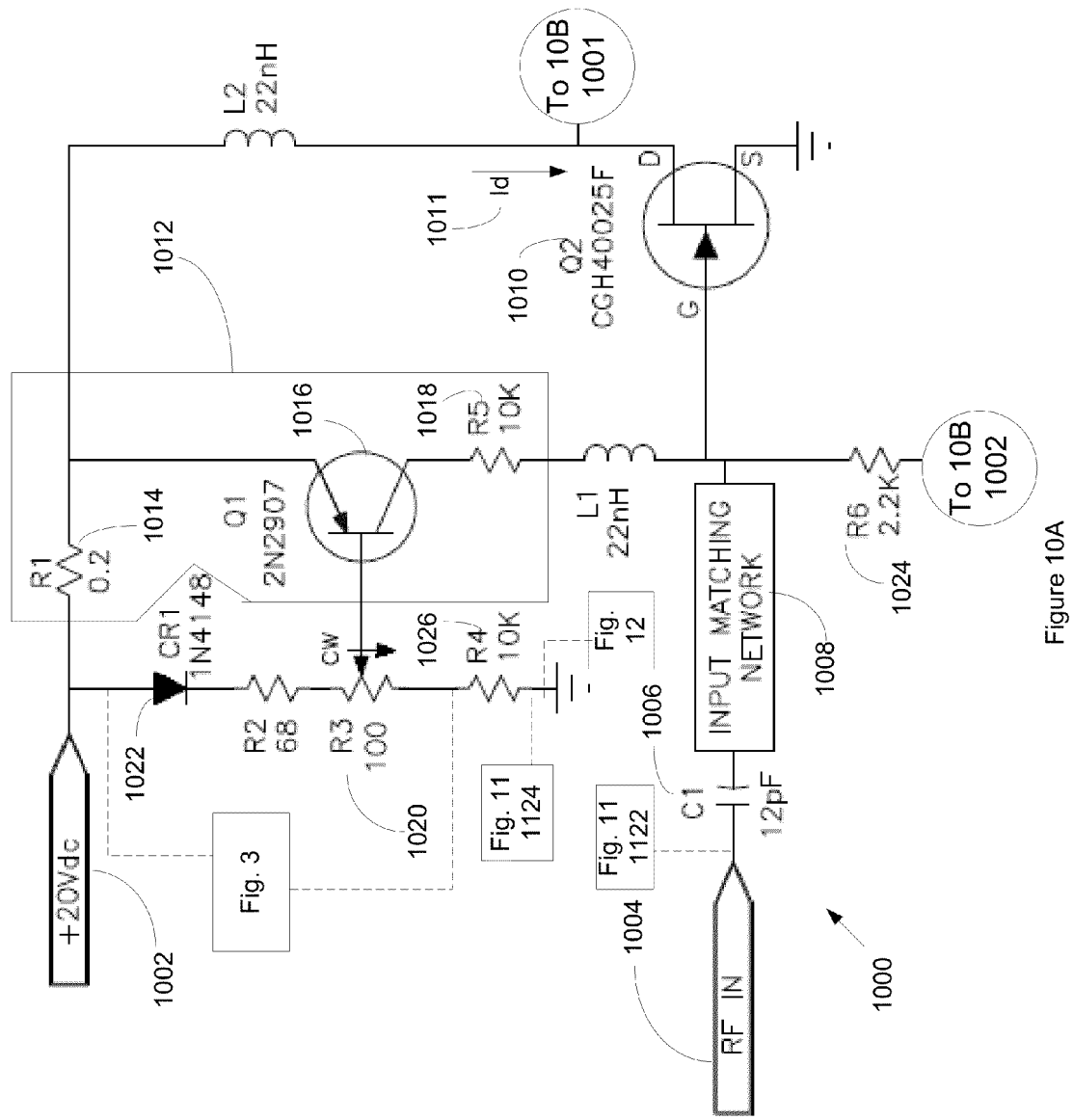
FIG. 10A is a schematic of a first half of a first embodiment of a GaNFET-based amplifier of the present invention with gate bias circuit for connection with the remaining circuitry of FIG. 10B.
Figure 10B:
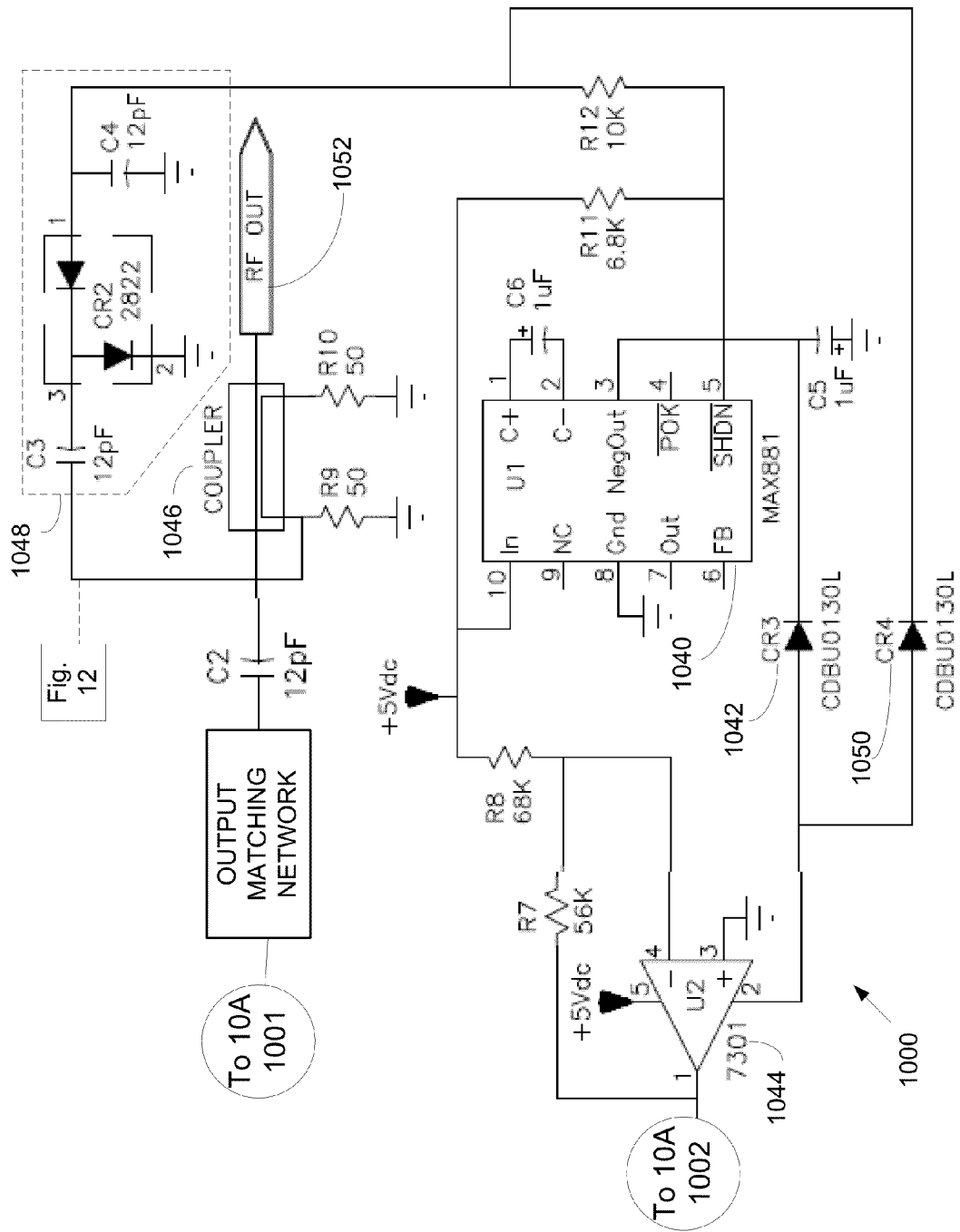
FIG. 10B is a schematic of a second half of a first embodiment of a GaNFET-based amplifier of the present invention with gate bias circuit for connection with the remaining circuitry of FIG. 10A.

With reference to FIGS. 10A and 10B, one of the advantages of the GaNFET amplifier 1000 over prior circuits is that it does not attempt to minimize the spurious responses caused by the negative voltage deriver IC by better decoupling or improved grounding or any of the other techniques shared in the application notes. Rather, amplifier 1000 eliminates the problem entirely by shutting down the oscillator 1040 once it is no longer needed. In general, the oscillator of negative voltage driver U1 1040 is only needed momentarily as a "starter" for a few milliseconds, i.e., long enough for transistor Q2 1010 to come to life. To avoid the undesired effect of the spurious oscillator signal of the negative voltage driver U1 1040, the invention shuts down the driver after start up and relies on the RF output transistor Q2 itself to maintain operating conditions. The RF on the drain of Q2 1010 generates and provides the negative supply for the transistor. Once the transistor Q2 1010 "comes to life" and self supplies the negative gate voltage then the negative voltage driver 1040 shuts down and in this manner the amplifier 1000 removes the spurious oscillator signal of the driver 1040.

Amplifier 1000 is connected to supply voltage 1002 (+20 VDC) and receives RF IN 1004 which is connected to the gate of transistor Q2 through capacitor 1006 and input matching network 1008. In this example, transistor Q2 1010 is a GaN-FET having part number GCH40025F, as described above. Referring to FIG. 10B, negative voltage driver U1 1040 as connected generates approximately −5.0 VDC at output 3 (NegOut). This voltage then passes through Schottkey diode CR3 having part number CDBU0130L, such as made by Discrete Semiconductor Products, to present −4.6 VDC to the negative supply (input 2) of operational amplifier U2 1044. U2 1044, as connected at node 1002, then presents a regulated −4.5 VDC to resistor R6 1024. The key is to configure the circuit so that the level is more negative than the level required to shut down Q2 1010. The gate bias circuit 1012 includes drain current sensing resistor R1 1014, bipolar PNP transistor 1016 (connected to potentiometer R3 1020), and resistor R5 1018 and operates much as does the LDFET gate bias circuit 201 described above except in the case of the GaNFET gate bias circuit the voltage increases to the value required by starting from a negative potential rather than from ground (as in the case of the LDFET bias circuit 201). In both cases the sense is positive, i.e., increasing voltage on the transistor gate, in this case of transistor Q2 1010, causes an increase in drain current, in this case drain current Id 1011.

The shutoff function is accomplished by a coupler 1046 which pulls a fraction of the RF power present at the drain of Q2 1010 and presents this power to the input of the negative voltage deriver 1048, comprised of capacitors C3 and C4 and diode pair CR2 (part number 2822), operating at the carrier frequency. This detected negative voltage is then presented to the negative supply (pin 2) of U2 1044 through CR4 1050. In addition, this negative voltage is connected to resistor R12 which in conjunction with resistor R11 are connected to pin 5 (SHDN) of U1 1040 and causes the oscillator section of U1 to shut down. U1 1040 then in effect acts as a starter, i.e., it operates only long enough for the amplifier U2 1044 to begin delivering RF power and then automatically shuts off thereby eliminating spurs caused by its internal oscillator.

The remainder of the circuitry in FIG. 10 acts similarly to that of FIG. 2 in that as the gate voltage is increased (less negative), the current in the drain of Q2 increases until an equilibrium point is reached.

The various improvements described above and shown in relation to FIGS. 3-8 as relating to the LDFET implementation of the invention also may be applied in the context of GaNFET implementation of FIGS. 10A-10B. The optional temperature compensation circuit 300 described above for incorporation into the amplifier 200 of FIG. 2 (as shown at connection nodes 301 and 302) may also be included to the amplifier 1000 at the same location in the circuit as shown in FIG. 10A. Also, as described above in the LDFET implementation of FIG. 4, the circuit of FIG. 11 may optionally be included with the amplifier 1000 of FIG. 10A to overcome the disadvantage of drawing the same drain current Id 1011 whether or not there is any input RF power 1004 present. Connection points are shown on FIG. 10A with hatched lines. As with FIG. 4, the circuit of FIG. 11 includes an RF Level Detector, integrator U2 1134, that senses the input RF power 1004 and a comparator, U3 1146, that serves to shut off the drain current Id 1011 of Q2 1010 of FIG. 10A based on a threshold reference voltage. In this manner the amplifier 1000 avoids unnecessary current flow and resulting undesired effects.

Figure 12:
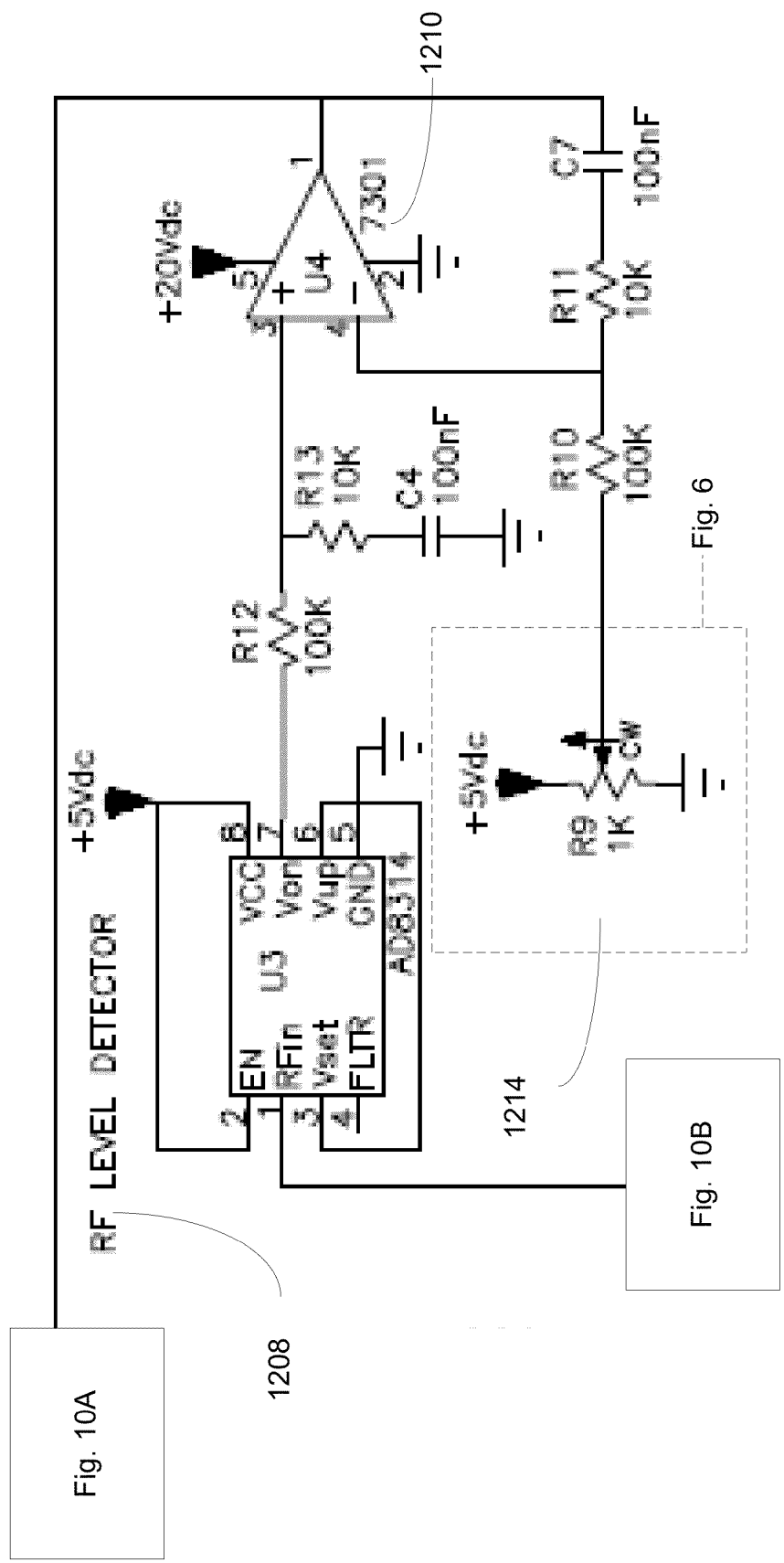
FIG. 12 is a schematic of an RF output power leveler circuit for use with the amplifier of FIGS. 10A/10B.

Also, as described above in the LDFET implementation of FIG. 5, the circuit of FIG. 12 may optionally be included with the amplifier 1000 of FIGS. 10A/10B. As described for the amplifier 500 of FIG. 5, the circuit of FIG. 12 includes an RF power leveler aspect. In operation, the output RF power 1052 is output from the Output Matching Network through coupler 1046, which is connected via input 1 (RFin) of integrator U3 1208. In this manner, U3 1208 senses the RF OUT 1052 and outputs at output 7 (Von) a corresponding DC voltage which is delivered to input 3 of integrator U4 1210 by way of circuit R12, R13, and C4. By comparing this voltage with a preset voltage from potentiometer R9 1214 the output of the integrator U4 1210 will increase or decrease the voltage to resistor R4 1026 of FIG. 10A to control operation of transistor Q1 1016 so as to cause the drain current Id 1011 associated with transistor Q2 1010 to increase or decrease as required to maintain an essentially constant output RF power 1052.

As shown by the hatched lines on FIG. 12, the circuit of FIG. 6, as described above, is an optional substitute circuit for use in the circuit of FIG. 12 and amplifier 1000 of FIGS. 10A/10B. FIG. 6 shows a digital to analog convertor 602 that is used in place of R9 1214 thereby permitting the RF output power to be controlled by a computer command.

In addition, the alternative circuit of FIG. 7, as implemented in conjunction with LDFET amplifier 700, may be employed in conjunction with GaNFET-based amplifier 1000 of FIGS. 10A/10B. The operation of transistor Q2 1010 of FIG. 10A as a high power gain block is similar to the operation of Q2 702 of FIG. 7 described above. Also, the optional digital attenuator 800 of FIG. 8 may be included in the circuit for operation with the GaNFET amplifier 1000 of FIG. 10A in the same manner as described above in the context of LDFET-based amplifier 700 of FIG. 7. With the optional digital attenuator, amplifier 1000 still performs as a gain block but with the added feature of selectable gain and also retains the advantage of drawing only that current Id 1011 required to maintain the desired gain.

Figure 11:
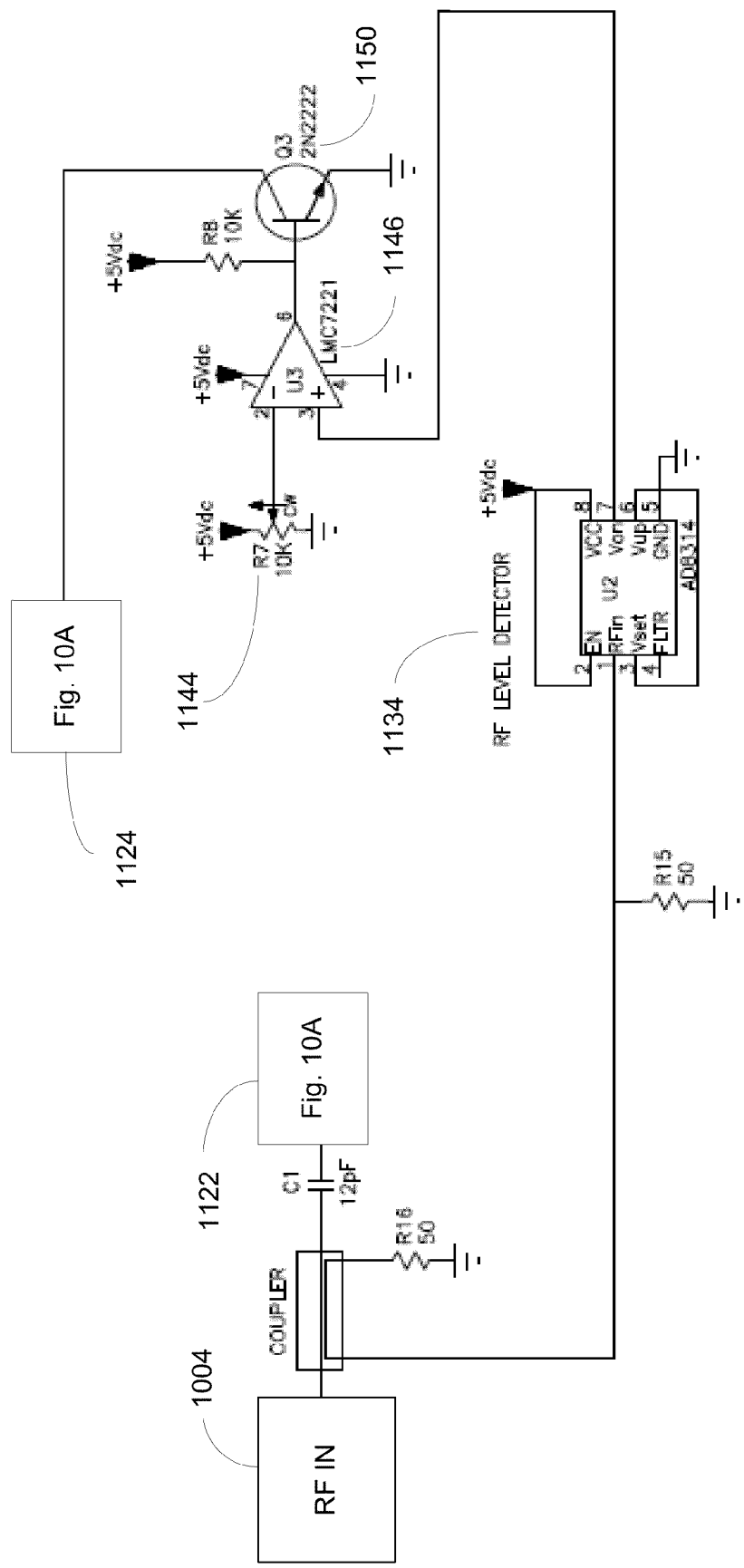
FIG. 11 is a schematic of an RF power monitoring and drain current control circuit for use with the amplifier of FIGS. 10A/10B.

These circuits thus far described, including specifically FIGS. 10-12 related to GaNFET embodiments, also operate with other negative voltage gate devices such as N-Channel Junction Field Effect Transistors (JFET) and Gallium Arsenide Field Effect Transistors (GaAsFETS).

The present invention is intended for many uses and applications including in design and manufacture of airborne and ground-based telemetry equipment. Telemetry systems comprise transmitters, receivers, and power amplifiers in a wide variety of frequency ranges. Although many aspects of the various embodiments of the invention are described in the analog domain it should be understood that this is for purposes of explaining the invention and that the invention may be used in conjunction with digital processing devices and techniques including the use of microprocessors, memory, etc.

Figure 13A:
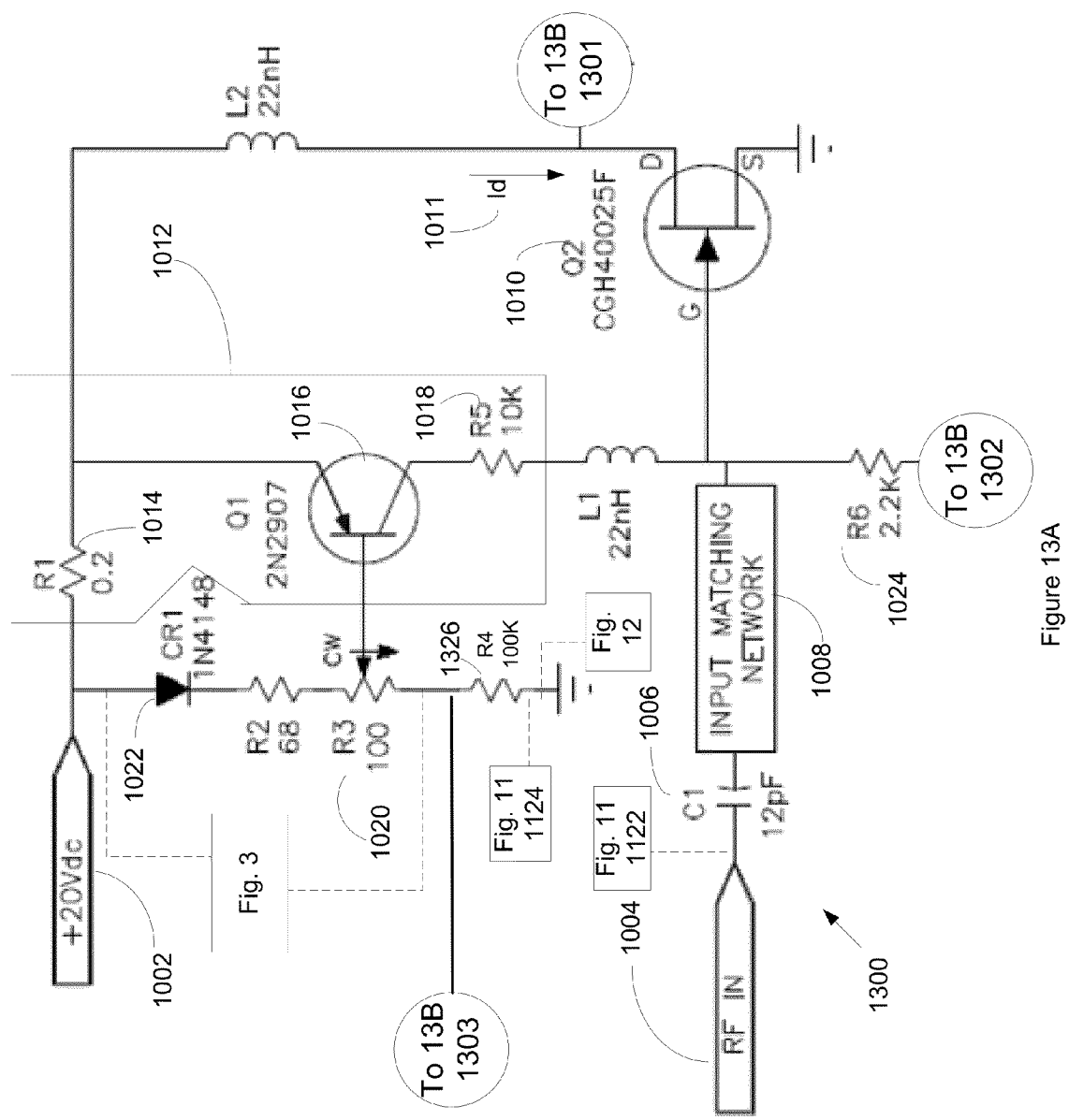
FIG. 13A is a schematic of an alternative second embodiment of a GaNFET-based amplifier of the present invention with gate bias circuit for connection with the remaining circuitry of FIG. 13B.
Figure 13B:
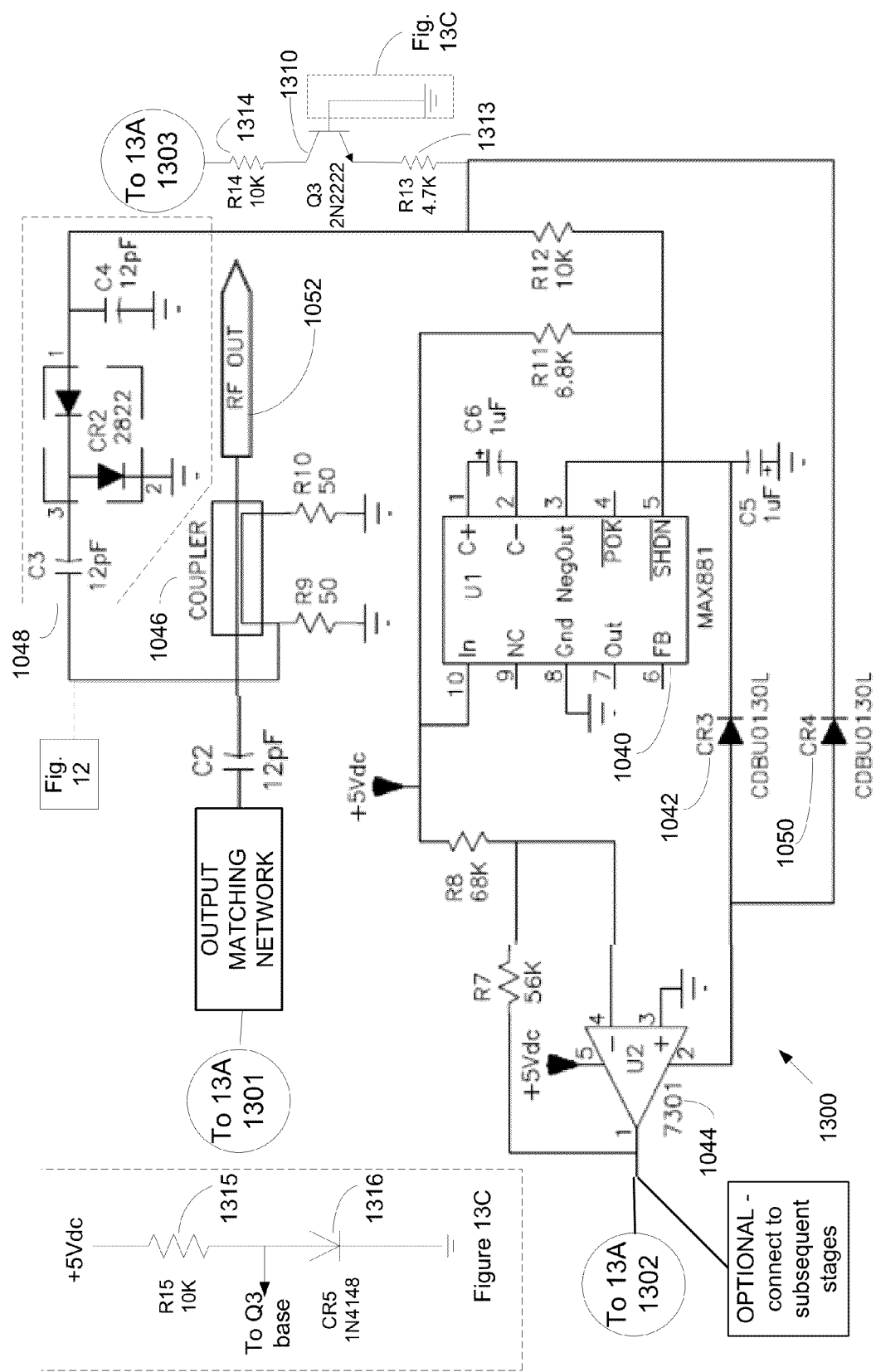
FIG. 13B is a schematic of a second half of the alternative second embodiment of a GaNFET-based amplifier of the present invention with gate bias circuit for connection with the remaining circuitry of FIG. 13A.

FIGS. 13A/13B illustrate an alternative embodiment that corresponds to the GaNFET-based amplifier of FIGS. 10A/10B. With reference to FIG. 13B, as described in detail above in the context of FIG. 10B the output of the dual diode-based negative voltage deriver 1048 provides a voltage source for the bias circuit. In addition, the output of the negative voltage deriver 1048 provides a crude measure of the output power. By adding resistors 1313 (R13) and 1314 (R14), and transistor 1310 (Q3) to the previous circuit of FIGS. 10A/10B, drain current 1011 will vary to supply only the current required to deliver that output power. In this regard, this circuit will perform similarly to a Class H amplifier except drain current is modulated rather that drain voltage. Class H amplifiers operate with infinitely variable supply rails. This is done by modulating the supply rails so that the rails are only a few volts larger than the output signal at any given time. Switching regulator power supplies are commonly used to create the tracking rails. The problem with Class H amplifiers is that switching regulators have notoriously low bandwidth, usually sufficient only for audio frequencies. The circuit of the invention on the other hand can operate well into the MHz range and is a far simpler and less expensive implementation.

In accordance with this alternative design, the exemplary 10K ohm resistor 1026 of FIG. 10A is replaced with a 100 K ohm resistor 1326 in the circuit of FIG. 13A. In operation, a small current through resistor 1326 (R4) results in a residual drain current in transistor 1010 (Q2) sufficient only to keep it "alive" or "active" and capable of amplifying. As a RF signal is applied to the RF input 1004 (FIG. 13A), this signal is amplified and a negative voltage is generated at the output of the dual diode detector CR2. Transistor 1310 (Q3) then begins conducting thereby lowering the voltage at the base of transistor 1016 (Q1), causing more drain current to flow through transistor 1010 (Q2). Note that this drain current will only be sufficient to generate the output power as determined by the level on input power and the gain of Q2. Resistor 1314 R14 prevents Q2 from excessive drain current by limiting the extent to which the base of Q1 can be lowered in voltage due to Q3 entering saturation should the dual diode detector/resistor 1313 R13 combination call for excessive current. This circuit thereby protects RF transistor from damage.

With continuing reference to FIG. 13B, the negative regulated voltage at the output of amplifier 1044 (U2) can optionally be provided to subsequent amplifier stages so that the circuitry of FIG. 13B would not need to be repeated resulting in significant efficiencies. As shown in FIG. 13B, the base of transistor Q3 may be connected to ground. Alternatively, and as shown in FIG. 13C, the base of Q3 may be connected to the circuit comprising +5 Vdc through 10 K ohm resistor 1315 (R15) diode 1316 (CR5) to ground.

Now with reference to FIG. 14, in one embodiment the present invention provides an improved N-Channel depletion device-based amplifier 1400 with a novel gate bias circuit 1401 (largely as discussed hereinabove in connection with other exemplary embodiments) and a novel sequencer circuit as shown in hatched line 1402, which is particularly useful in RF receiver/transceiver applications. Bias sequencer circuit 1402 includes a P-channel enhancement mode MOSFET pass transistor 1404 for use in operation of Q3 1406—an N-channel depletion mode device—in conjunction with drain choke inductor L1 1408. Amplifier 1400 also includes sampling circuit 1412 and negative voltage deriver circuit 1414. In this example, Q3 1406 is a device available from Cree, Inc. and having product number CGH40006P, which is a gallium nitride (GaN) high electron mobility transistor (HEMT) offering 28 VDC and up to 6 GHz operation. Gallium Nitride (GaN) HEMTs (High Electron Mobility Transistors) or GaN FETs or GaN MMICs (Monolithic, Microwave Integrated Circuit) (referred to herein collectively and interchangeably) are a relatively new generation of RF power transistor technology that offers the operating characteristics of higher power, higher efficiency and wider bandwidth when compared with GaAs- and Si-based technologies, e.g., LDMOS FETs. GaN HEMTs are depletion mode devices, meaning a negative gate voltage and gate-drain bias sequencing is required for proper operation. With any N-Channel depletion device, such as GaAs FET, GaN FET, or N-channel silicon junction FET, it is essential that the negative gate voltage arrives before the drain voltage. Otherwise the drain to source resistance is a very low value which will essentially short out the input power and likely cause damage to several circuit components including the depletion device.

The CGH40006, operating from a 28 volt rail, provides a general purpose, broadband solution to a variety of RF and microwave applications. GaN HEMTs provide high efficiency, high gain and wide bandwidth capabilities making them attractive for linear and compressed amplifier circuits in a variety of applications, including aviation, communication (including telecommunications), weather RF. Moreover, material characteristics associated with wide-bandgap III-nitride materials such as AlGaN/GaN HEMTs make them attractive for use in integrated circuits to perform reliably in operations at high temperature not readily possible for silicon- or GaAs-based devices. These high-temperature digital circuits provide improved and enabling technology for many applications including intelligent control and sensing for use in automotive, aviation, chemical reactor, and oil exploration systems.

Figure 14:
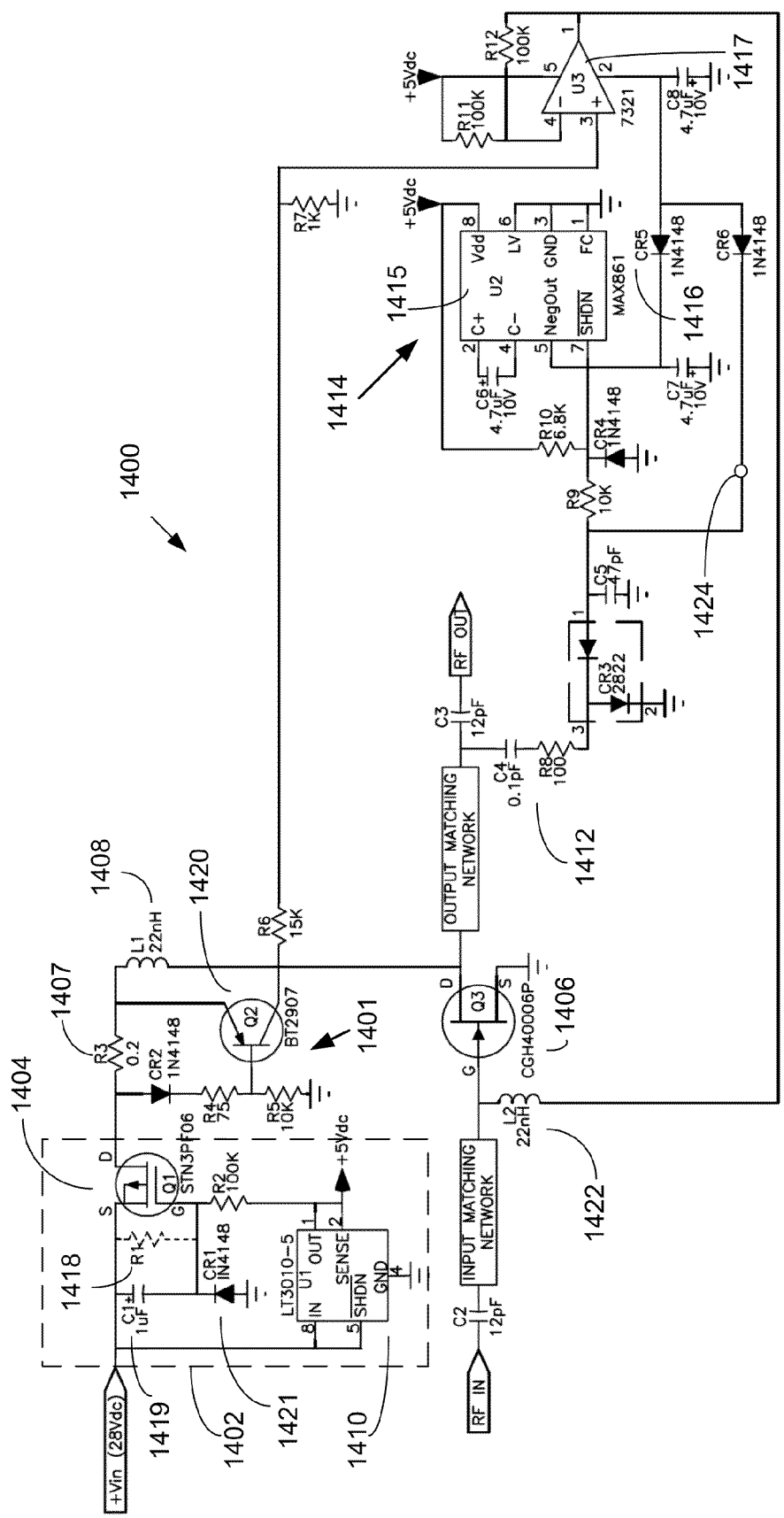
FIG. 14 is a schematic of a first embodiment of an improved N-Channel depletion device-based amplifier of the present invention with gate bias circuit and sequencer.

With continuing reference to FIG. 14, sequencer 1402 includes U1 1410, which is a low dropout positive voltage regulator that follows the input voltage within millivolts up until the desired output voltage is reached—in this case +5 VDC. Q1 1404 is an enhancement mode P channel MOSFET with a minimum Vgs threshold of between 2 VDC and a maximum of 4 VDC. Q3 1406 is a GaN FET device with a pinch off voltage of −3.0 VDC typically. Pinch-off refers to the voltage Vds that counteracts the opening of the n-channel (NMOS), at the drain end. Pinch off voltage is the minimum ground-to-source voltage for which drain current will become zero and if applied between drain and source then drain current starts saturating. The MOSFET or MESFET saturates (pinches off) when Vds is greater or equal than/to Vgs−Vtn. Negative Voltage deriver circuit 1414 includes U2 1415, which is a negative voltage deriver, such as an oscillator, that also is a low dropout device—i.e., its output voltage (at pin 5) follows its input voltage within millivolts, though inverted and therefore negative.

For example at a circuit input voltage of +5.0 VDC, U1 output will be approximately +4.9 VDC and the output of U2 1415 will be approximately −4.8 VDC. The negative rail of U3 1417 will then be about −4.1 VDC assuming a diode drop across CR5 1416 of 0.7 VDC. As the input voltage is increased from 0 VDC, the output of U1 1410 closely tracks the input until the specified regulator output voltage of +5 VDC is reached.

Assuming a minimum threshold voltage of 2 VDC for Q1 1404, this device will therefore not begin turning on until an input voltage on the +Vin line reaches 5 VDC+Vth=+7 VDC and at 7 VDC no current through drain choke inductor L1 1408. A threshold voltage of 4 VDC would increase this to +9 VDC. It is imperative that there is minimal current through Q1 1404 while in the linear state between fully off and fully on. This results in the minimum dissipation in this device which permits miniaturization, which is an important advantage to the invention. In the event it may be desirable to increase the apparent threshold voltage of Q1, a resistor can be placed between the gate and source as shown (R1) 1418.

With an input voltage of +7 VDC on the +Vin input line and assuming no drain current through Q3 1406, and no voltage at R3, Q2 1420 will be saturated since in this situation there is actually more base current than collector current. The Q2 1420 collector voltage will be at about +6.8 VDC which through voltage divider R6 (15 Kohm)/R7 (1 Kohm) will result in a voltage at Pin #3 of op-amp U3 of +0.425 VDC and a voltage at input #4 of U3 of 4.575 VDC. This would result in an output voltage of the op amp of −4.150 VDC which when applied to Q3 1406 through L2 1422 places this device well in to the pinch-off region—therefore no drain current. Voltage divider R6/R7 insures that Q1 does not have power dissipated through it (thus no need for heat sink). Even in a barely on condition current is only 1-2 milliamps. The voltage divider also sets the maximum voltage out of op amp U3 at −1.5 V and never positive as a safeguard for Q3 1406. This circuit ensures that Q1 is well on before current flows through the drain of Q3. In this circuit Q1 may be a small device avoiding the need for a heat sink thus resulting in desirable miniaturization. In addition, the circuit avoids the need for a coupler thus resulting in further miniaturization.

Drain current setting resistor R3 1407 is a sense resistor that sets the current through Q2. In addition, during fabrication, maintenance or repair, when Q3 is not part of the circuit leads may be provided to connect the circuit to various GaN/GaAs devices. Leads across R3 may be used to set current depending on the particular Q3 device used. In the example of FIG. 14, Q3 is a GaN HEMT device available from Cree, Inc. of Durham, N.C. (www.cree.com) having part number CHP40006P. Parts are also available from Gain Microwave (www.gainmicrowave.com) and from Nitronex Corporation (www.nitronex.com).

Working backwards through the circuit and assuming a threshold pinch-off voltage of −3.00 VDC for Q3 1406, it can be shown that this device starts conducting at an input voltage of +16.2 VDC on the +Vin line. From 7 VDC to 16.2 VDC there is no current through Q1. This shows that Q1 1404 is well into its low impedance state before there is appreciable current through it—again this being desired for minimal dissipation in this device.

Normal operation of Q3 1404 occurs with the gate at approximately −2.0 VDC although this varies somewhat from device to device, temperature, frequency, and time. This corresponds to an input voltage on the +Vin line of approximately +24 VDC. For any voltage above +24 VDC the circuit performs as the others described in this application. Note that another desirable feature of this circuit is that at input voltage of +28 VDC, the highest voltage that can be applied to the gate of Q3 is −1.5 VDC. It is important that this voltage never reaches a positive value or Q3 would likely be damaged or destroyed.

Operation of the negative deriving circuit 1414, U2 1415 and associated components, operate similarly to the previously described circuits involving depletion mode devices with the exception that the output RF power is sampled via sampling circuit 1412, comprising C4 and R8, rather than a coupler as described elsewhere with respect to other circuits, e.g., coupler 506 of FIG. 5. This also contributes to the advantage of circuit miniaturization.

The above circuit is described in the context of a first scenario in which +$V_{in}$ is, for example, a battery source that slowly rises at turn on from 0 to 28 VDC. In an alternative scenario, an instantaneous 28 VDC source may be switched on or otherwise supplied. In this scenario, capacitor C1 1419 slows down to allow the negative voltage to come up. Value for C1 in this example of FIG. 14 is 1 μF but may be derived from time needed to allow negative voltage deriver circuit to come up. In cases in which the +Vin is applied instantaneously, C1 1419 causes a delay in the turn on of Q1 1404 so that the negative generator 1414 will have time to power up and generate the negative gate voltage before the drain voltage arrives. Upon shut down, CR1 1421 provides a rapid discharge path for C1 1419 so that Q1 1404 shuts off before the negative gate voltage collapses. This prevents Q3 1406 from having drain voltage without a negative gate voltage which could result in damage to this device during shut down. If the output of U3 1417 goes positive, the Q3 would be damaged or destroyed as the GaN HEMT must always be negative. By using these techniques, the invention in essence "domesticates" Q3 1406.

Optionally, an automatic drain current adjustment circuit may be added to the circuit of FIG. 14 connecting between node 1424 and the input to base of Q2. For example, the emitter of an NPN bipolar transistor (not shown) may be connected through a resistor to node 1424 with the base of the BJT connected to a +5 VDC source (resistor-diode-ground arrangement) the collector of the BJT is connected through a resistor to the input circuit to the base of Q2 1420. In this manner, drain current may be set as a function of input power (sensed). For example, with low RFin and low RF out the node 1424 is not very negative and therefore can lower drain current.

In addition, features as described above in relation to other circuits may be used on connection with the circuit of FIG. 14 and those that follow. For instance, RF level detectors (712/714), adjusting means to set current (716), failure detection, damage prevention, etc. Likewise use of features described in connection with FIGS. 14-19 may be used in connection with other circuits discussed above. For example, an opto-coupler may be used as the negative voltage generator U2 1415 of FIG. 14 and for the negative voltage generator U1 1040 of FIG. 10B. An exemplary opto-coupler is the opto-isolated photovoltaic Iso-gate MOSFET Driver available from Dionics, Inc. (www.dionics-usa.com) with part number DIG-12-06-250M.

Also, in comparing the circuit of FIG. 14 (and those that follow) with that of FIG. 10A/B, we see that the circuit of FIG. 14 has the advantage of going directly into the gate of Q3 1406 (FIG. 14) rather than through resistor R6 1024 and into Q2 1010 (FIG. 10A). For example, R6 1024 makes the circuit too soft in that much over 1 milliamp from gate overwhelms and makes it less negative at R6 and this may lead to loss of control of circuit. Preferably the circuit operates at −2.0 V at 1 milliamp. For example, in one application the standard is around 2 milliamps and with the circuit of FIG. 14 operation works for Q3 1406 up to 5 milliamps gate current. Also, the circuit of FIG. 14 provides greater miniaturization in using Q1 1404, which does not need a heat sink and replaces external sequencer not shown with respect to the circuits shown in FIGS. 2-13. Also, the circuit of FIG. 14 and those that follow do not need two sequenced supplies for gate and drain but rather a single supply Vin for input into the internal sequencer, e.g., 1402.

Now referring to FIG. 15, in this embodiment the present invention provides an improved N-Channel depletion device-based amplifier 1500 with a novel gate bias circuit 1501 (largely as discussed hereinabove in connection with other exemplary embodiments) and a novel sequencer circuit as shown in hatched line 1502. The purpose of the sequencer 1502 is to ensure that the GaN device Q4 1506 is in pinch-off before the drain voltage is applied. If the drain voltage is applied before the gate voltage, Q4 1506 essentially acts as a short circuit and either it or the power supply or both will be destroyed. Since GaN transistor devices are N-Channel enhancement mode devices, this means that the gate voltage (Vgs) must be at the most negative specified voltage threshold or less (more negative). For this example, a negative gate voltage of −3.8 Vdc or more negative is required to assure pinch-off for Q4 1506. Bias sequencer circuit 1502 includes Q1 1504, which is an enhancement mode P-Channel MOSFET with a minimum specified threshold voltage of −1 Vgs and a maximum of −3 Vgs. U1 1510 is a low drop-out regulator with a drop out voltage<0.5 Vdc.

As Vin increases from 0 Vdc to +5 Vdc, the output of the low drop out regulator U1 1510 tracks the input within 0.5 Vdc. Therefore the Vgs of Q1 1504 is always <−0.5 Vdc so Q1 is off during that period. When Vin reaches +7 Vdc, Q1 reaches its lower specified threshold voltage of −1 Vgs due to the voltage dividing action of R1 and R5.

As Vin further increases, Q1 1504 will begin conducting. When the drain of Q1 reaches approximately +1.4 Vdc, Q2 1505 turns on and pulls the gate of Q1 more negative with respect to its source. Thus Q2 1505 provides regenerative feedback to Q1 causing it to operate in a lower Rds region. This is desirable so as to minimize the dissipation in Q1.

At the upper Vgs threshold specification of −3 Vgs, Q1 will begin turning on at a Vin of +11 Vdc. Similar to above when Q1 begins conducting and its drain reaches +1.4 Vdc, it will be turn on harder due to the regenerative feedback action of Q2 1505.

One very desirable feature of this circuit is that the switching transistor Q1 1504 conducts essentially no current during its transition between the On and Off states so as to minimize dissipation in this device as is required for circuit miniaturization. Therefore Q4 1506 must be in pinch-off during this transition—which we will now prove.

At Vin of 11 Vdc (the upper limit of threshold voltage for Q1) the non-inverting input (pin #3) to op amp U3 1517 will be at +1.19 Vdc. The output (pin #1) of U3 1517 will then attempt to go to −4.98 Vdc but will be limited by the negative rail to actually go to approximately −4.4 Vdc. This voltage is then applied to the gate of Q4 1506 through L3. Since the CGH4000P has a maximum pinch-off specification of −3.8 VDC, it will be well into pinch-off. At the lower threshold voltage specification of Q1 of −1 Vgs, the output of U2 will attempt to go to an even more negative voltage but will be again be limited to approximately −4.4 Vdc so Q4 will be well into in pinch-off in either case.

Normal operation of Q4 occurs in the −2 Vgs region which will require Vin=+21.5 Vdc which is well below the recommended +28 Vdd for the device. This means that once Vin exceeds +21.5 Vdc, the sequencer falls out of the circuit and will in no way interfere with the correct operation of Q4.

For the case in which Vin is applied instantly, C1 1519 prevents Q1 1504 from turning on until U2 1515 and associated circuitry is able to provide the required negative voltage. With the values shown, U2 1515 reaches −5 Vdc in approximately two milliseconds whereas C1 1519 delays the turn on of Q1 for about 20 milliseconds (mS).

During power shutdown it is imperative that Q1 shuts off before the negative gate bias to Q4 is removed. This is accomplished by CR1 1521 which provides a low impedance path to C1 1519 so that Vgs of Q1 1504 will be removed within microseconds whereas C8 will hold the negative gate voltage to Q4 for approximately five mS.

R24 and C12 offer an amplitude modulation input port 1526 which operates as follows. Q4 must first be driven well into saturation—by increasing the input RF drive by 6 dB (for example) beyond the one dB compression point (P1 db). Further, the drain current should be set well below its maximum recommended value—for example 50%. While operating in this configuration, output RF power will now be determined by the drain current rather than by the input RF drive as is the usual case for amplitude modulated amplifiers. As the voltage to the modulation input port is increased (more positive), Vgs increases (less negative), the drain current then increases, and as a direct result the output RF power also increases. In this manner the amplitude of the output RF power is modulated by the signal at the modulation input port.

This circuit will find significant application in advanced digital modulation applications which depend upon amplitude modulation. The advantage of this circuit is that it always operates in saturation as opposed to conventional AM amplifiers which operate in Class-A. The accompanying increase in efficiency will be very substantial. For example Class-A amplifiers have a maximum theoretical efficiency of 50% whereas saturated amplifiers can exceed 80%.

Figure 15:
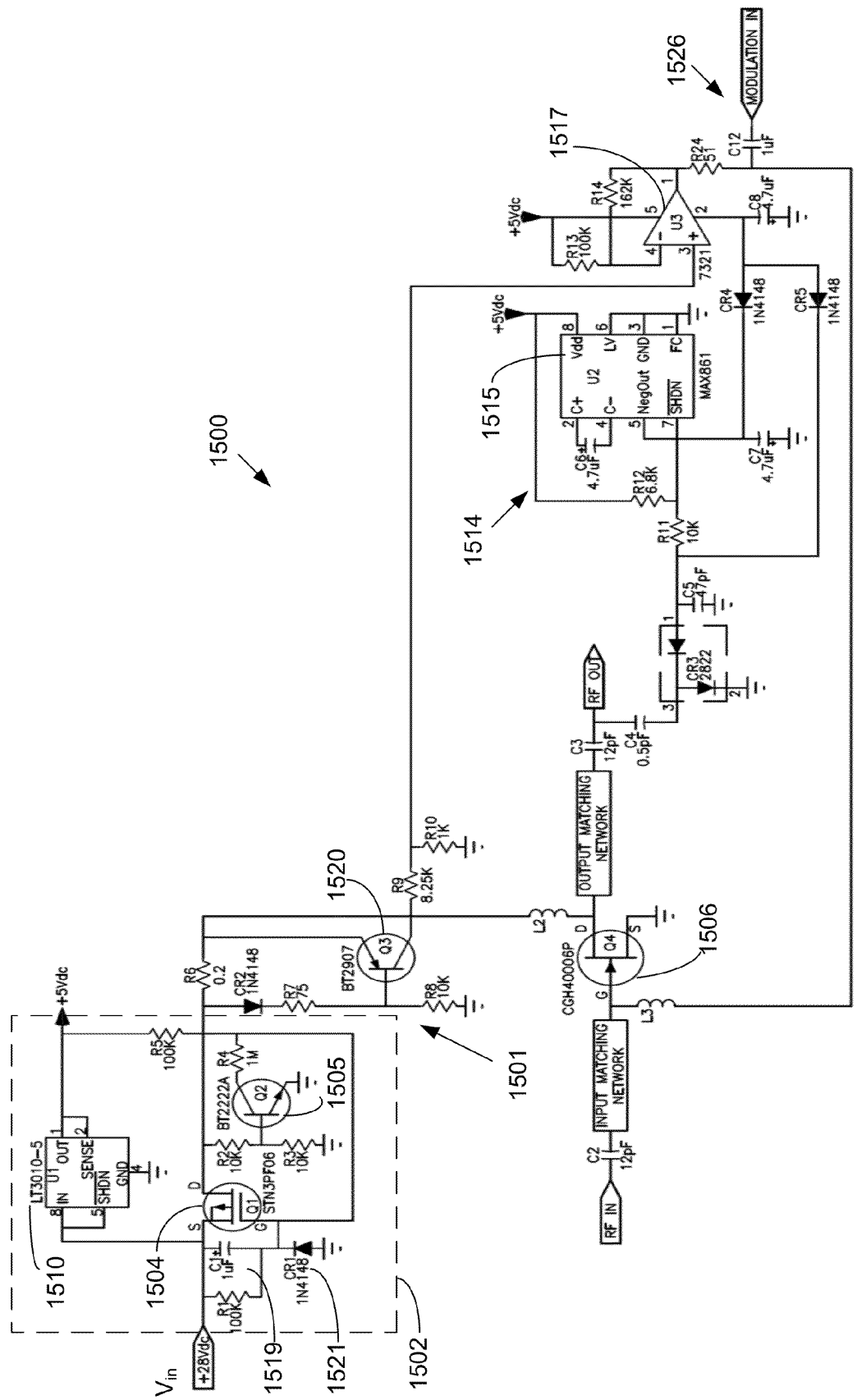
FIG. 15 is a schematic of a second embodiment of an improved N-Channel depletion device-based amplifier of the present invention with gate bias circuit and sequencer.
Figure 16:
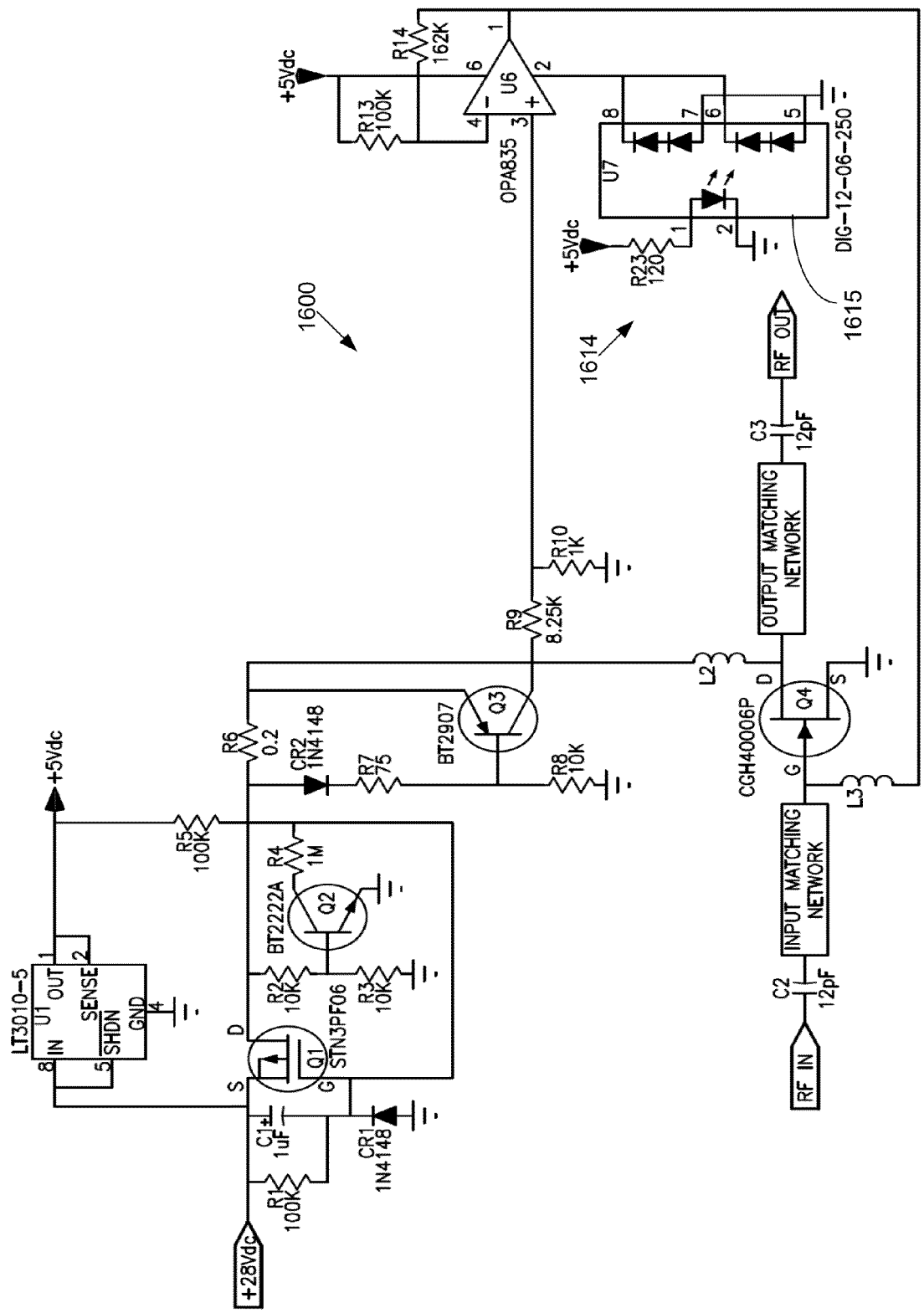
FIG. 16 is a schematic of the circuit of FIG. 15 having a optically coupled negative generator circuit.

Now referring to FIG. 16, a circuit 1600 is shown that is in essence the circuit 1500 of FIG. 15 modified to replace the U2-based negative voltage deriver circuit 1514 with an Optically Coupled Negative Generator circuit 1614. Circuit 1600 operates much as circuit 1500 with the difference that an optically coupled isolated voltage generator U7 1615 is substituted for the negative voltage generating oscillator 1515. With the positive output pins (5 & 7) of U7 1615 grounded, a negative voltage is available on Pins 6 & 8. Since this is a spur-free generator, there is no need to shut it off as in the previous circuits. The disadvantage is that the generator's output is in the microamp range so this circuit will operate only with GaN devices with very low gate current.

Figure 17A:
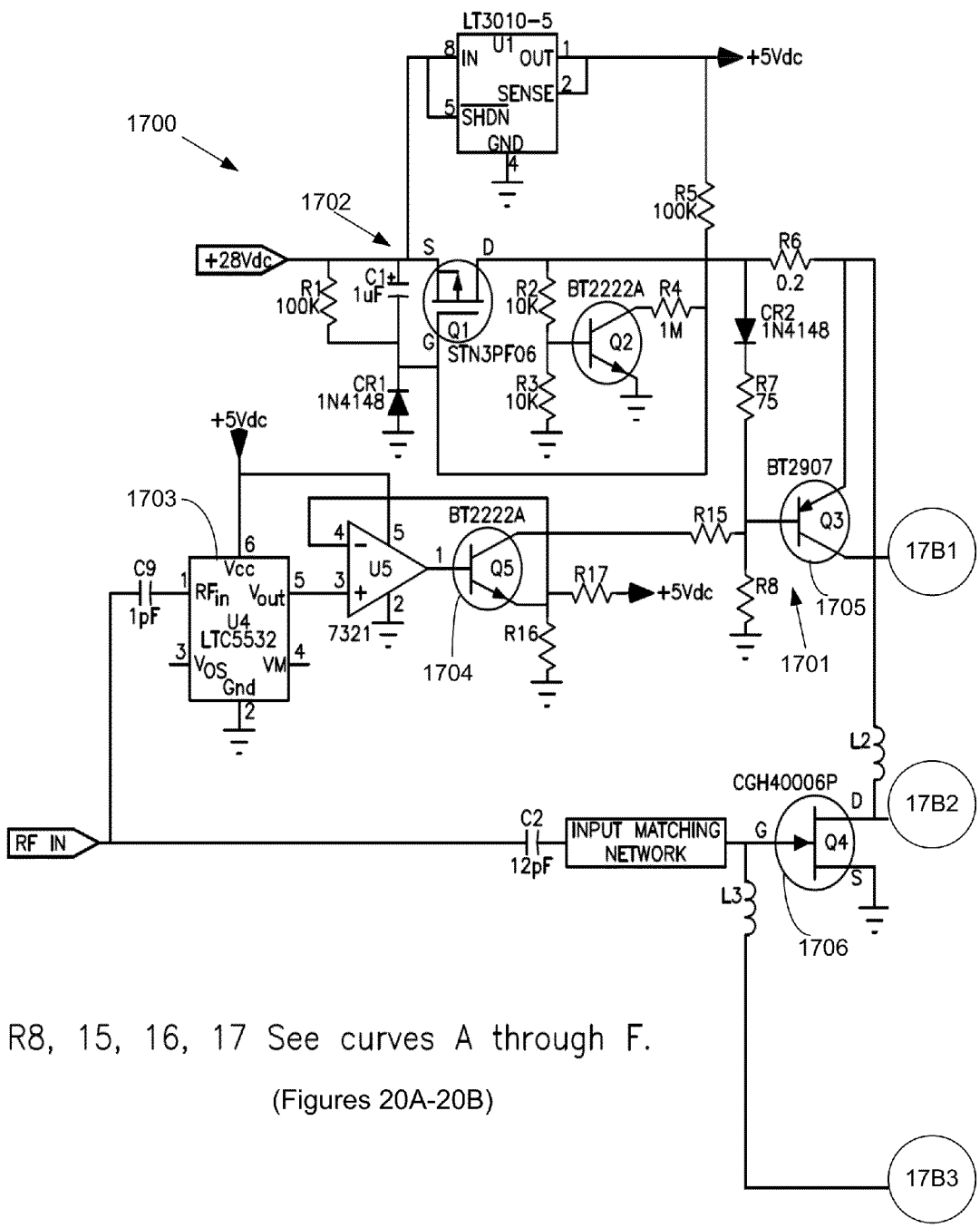
FIG. 17A is a schematic of a first half of a third embodiment of an improved N-Channel depletion device-based amplifier of the present invention with gate bias circuit and sequencer and having an adaptive current control circuit.
Figure 17B:
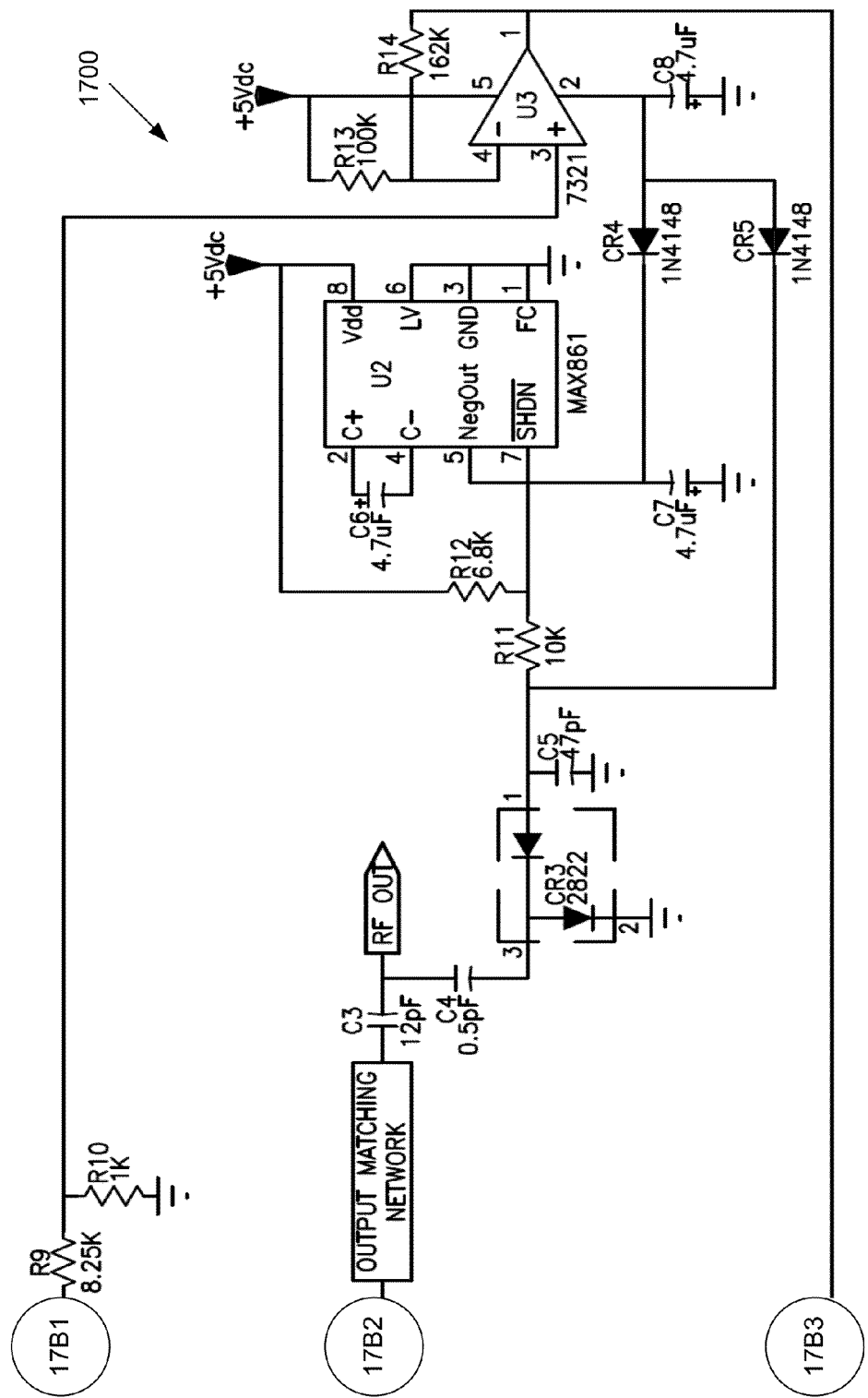
FIG. 17B is a schematic of a second half of the circuit of FIG. 17A.

Now referring to FIGS. 17A and 17B, showing connecting points 17B1-17B3, in this embodiment the present invention provides an improved N-Channel depletion device-based amplifier 1700 with a novel gate bias circuit 1701 (as discussed hereinabove in connection with other exemplary embodiments) and a novel sequencer circuit 1702 along with an Adaptive Current Control Circuit. The Adaptive Current Control Circuit includes U4 1703, which along with its associated components adds several useful features to the control circuit. U4 1703 measures the input RF power and outputs a voltage which is approximately linear over its input power range of −5 dBm to +5 dBm. The output of U4 (pin #5) goes to an emitter follower Q5 1704 the collector of which acts as a variable current sink. As the input power is increased, the output voltage of U4 1703 increases which in turn causes Q5 1704 to sink more current. As this current is drawn from the junction of R7, R8, R15 and the base of Q3 1705, the voltage across the sense resistor R6 is increased causing the drain current of Q4 1706 to increase. The numerous applications for the circuit, including the Adaptive Current Control Circuit which lowers drain current for greater efficiency, includes CDMA (code division multiple access) based and other RF and radio communication technologies.

Figure 20A:
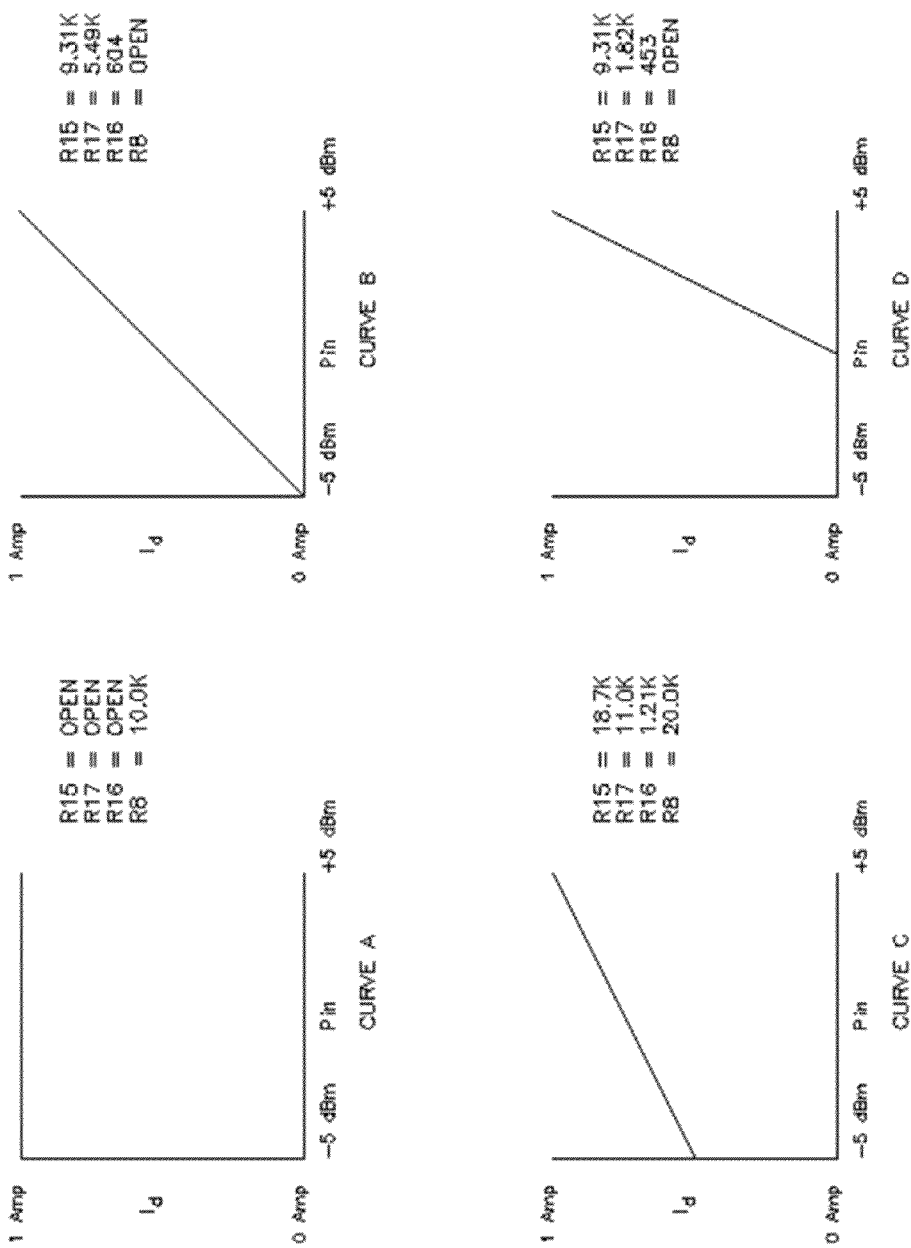

Note that as resistors R8, R15, R16, R17 are adjusted, an infinite number of RF input power versus drain current curves are made possible. See FIGS. 20A and 20B sample curves A through G. Curve A is the constant current configuration which operates as the circuits of the main patent. Curve B is especially interesting in that it causes the circuit to perform as an adaptable Class-A device—i.e. the drain current of Q4 1706 changes as a function of the input RF power. The overall circuit therefore performs with the efficiency of Class-AB operation but with the linearity of Class-A. Traditional Class-A circuits draw the same current independently of input RF power resulting in much worse efficiency at low input levels.

Curve C would result in some residual current to keep Q4 "alive" with low or no input signals. This is often desirable as the GaN devices can go unstable with low drain current. Curves D and F are related, the difference being the steepness of the Pin versus Id slope. Curve F is essentially a switch turning on Q4 1706 only when input RF is present. Curve E is a combination of Curves C and D.

Figure 18A:
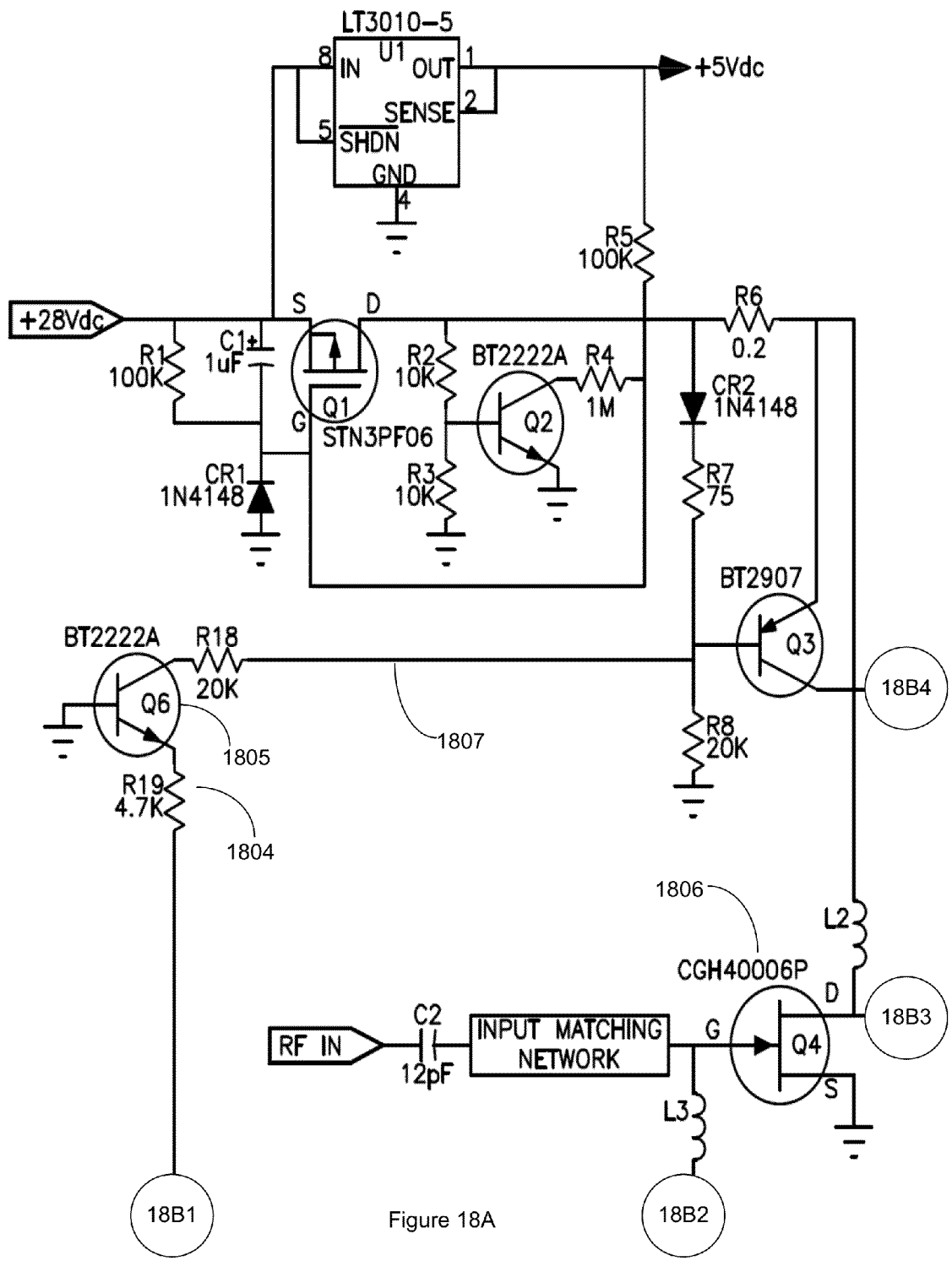
FIG. 18A is a schematic of a first half of an alternative circuit of FIG. 17 A/B having an output RF power detecting and feedback circuit.
Figure 18B:
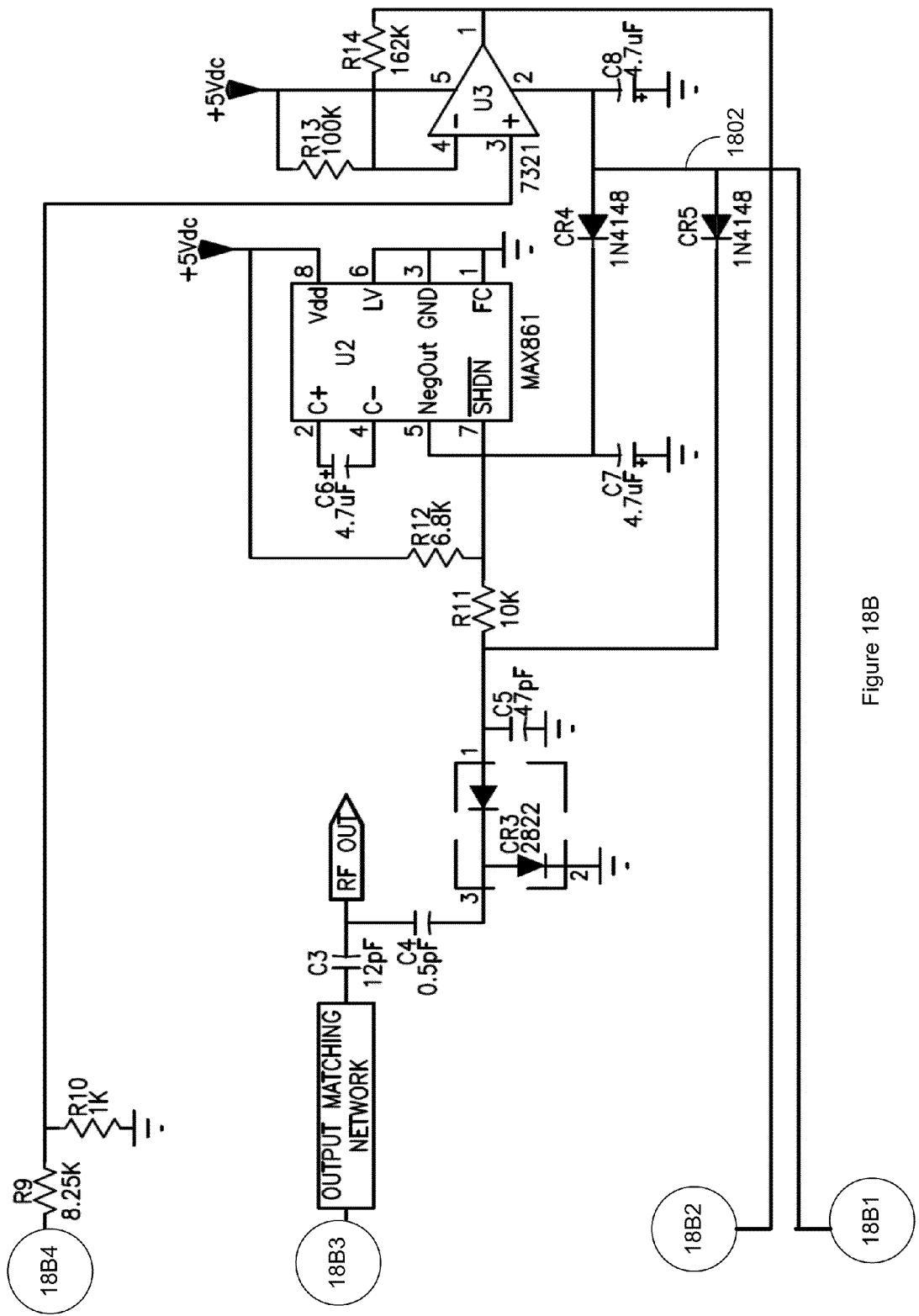
FIG. 18B is a schematic of a second half of the circuit of FIG. 18A.

Now referring to the circuit of FIGS. 18A and 18B, showing connecting points 18B1-18B4, the negative voltage at the junction of CR4, CR5, C8, and U3 1802 (FIG. 18B) is a rough measure of the output RF power. When this voltage is applied to R19 1804 (FIG. 18A) a current is pulled from the emitter of Q6 1805 and ultimately from the junction 1807 of R7, R18, R8, and Q3. As the output power is increased, more current is drawn from the junction which in turn causes Id of Q4 1806 to increase. Note that this circuit requires a residual current as in Curve E set by R8 lest the circuit will not start. R18 sets the maximum Id since at some point Q6 will saturate and no more current will be drawn from the above junction regardless of the level of output power.

Figure 19A:
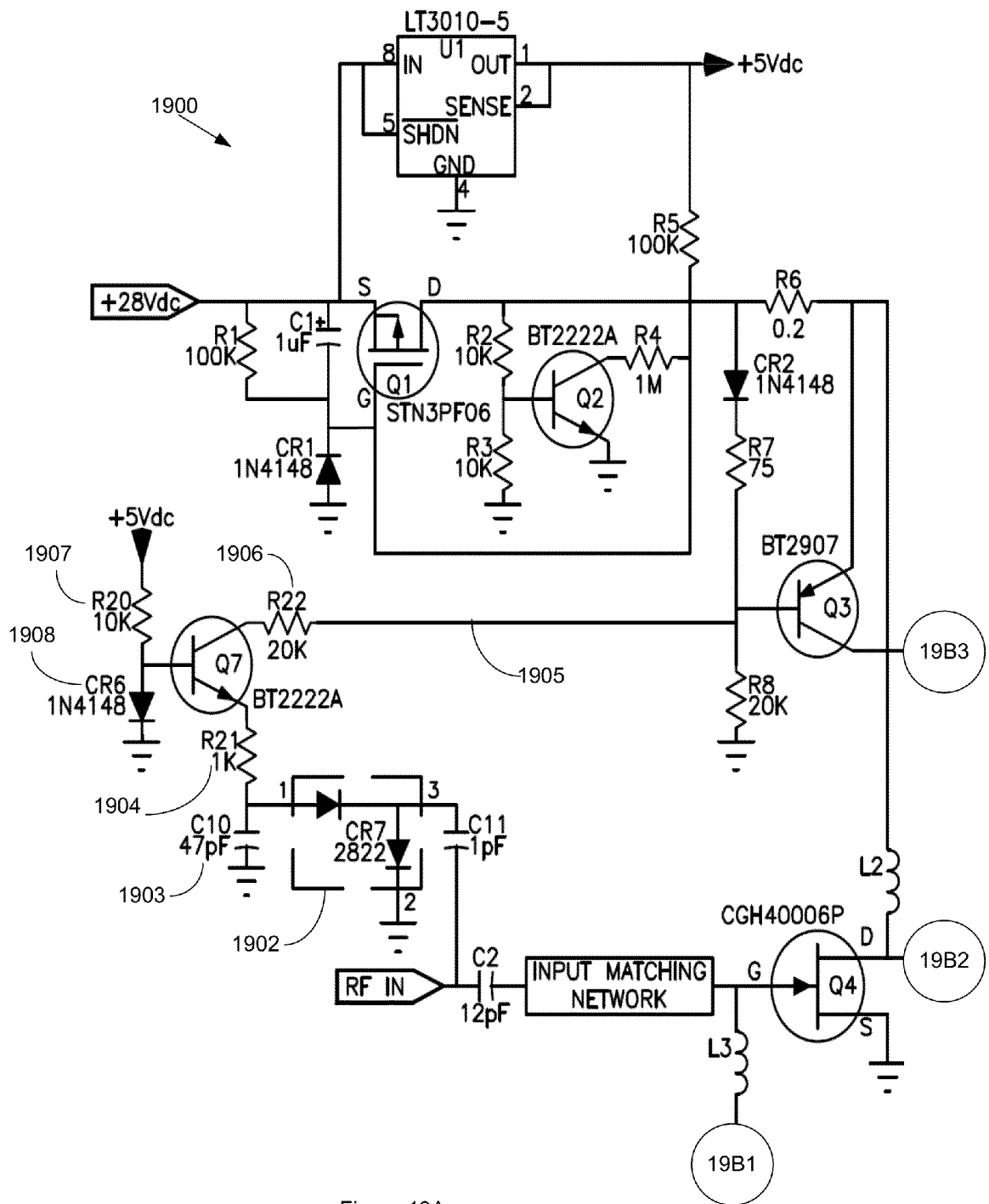
FIG. 19A is a schematic of an alternative second embodiment of an adaptive current control circuit to that of FIG. 17 A/B.
Figure 19B:
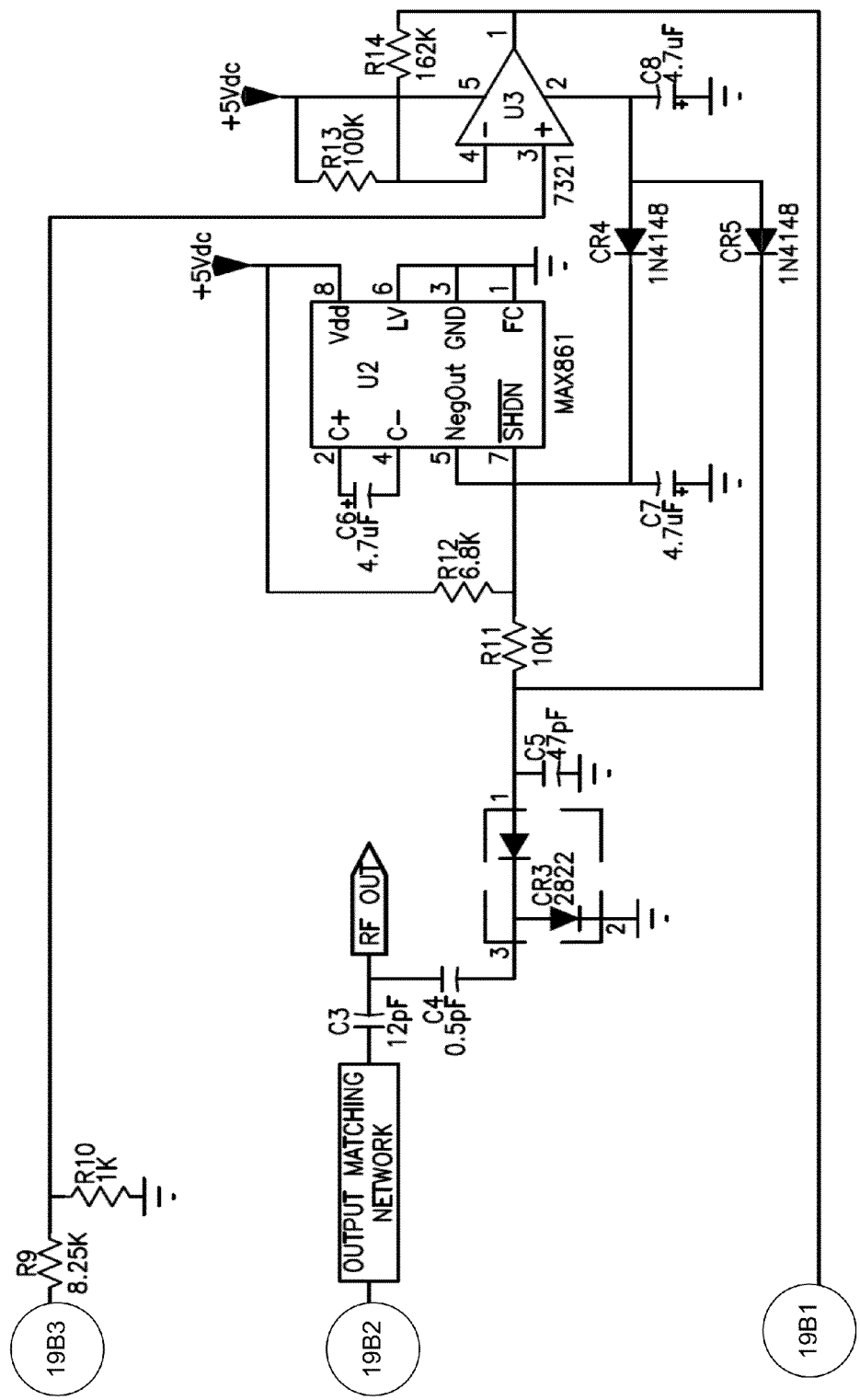
FIG. 19B is a schematic of a second half of the circuit of FIG. 19A.

Now referring to the circuit of FIGS. 19A and 19B, showing connecting points 19B1-19B3, circuit 1900 is a less sophisticated version of the Adaptive Current Control Circuit of FIGS. 17A and 17B but is also less costly and occupies less space leading to further miniaturization. Unlike the circuit of FIGS. 18A and 18B, circuit 1900 does not require a residual current thereby permitting it to act as a switch—turning on Id only when input RF power is present. Curves A through G of FIGS. 20A and 20B can be approximated with this circuit but with somewhat less accuracy than with the circuit of FIGS. 17A and 17B. CR7 1902 and C10 1903 (FIG. 19A) detect the input RF level and convert this to a negative voltage which is applied to R21 1904. This then draws current from the junction 1905 of R7, R8, R22, and Q3 acting through Q7. Similar to above, R22 1906 sets the maximum current that can be drawn from this junction 1905 effectively setting the maximum Id. R20 1907 and CR6 1908 bias the base of Q7 to approximately +0.7 VDC which puts the emitter of Q7 very close to 0 VDC so that the detector can operate correctly at low levels of input RF power. CR6 1908 also temperature compensates the Vbe of Q7.

The present invention is not to be limited in scope by the specific embodiments described herein, It is fully contemplated that other various embodiments of and modifications to the present invention, in addition to those described herein, will become apparent to those of ordinary skill in the art from the foregoing description and accompanying drawings. Thus, such other embodiments and modifications are intended to fall within the scope of the following appended claims. Further, although the present invention has been described herein in the context of particular embodiments and implementations and applications and in particular environments, those of ordinary skill in the art will appreciate that its usefulness is not limited thereto and that the present invention can be beneficially applied in any number of ways and environments for any number of purposes. Accordingly, the claims set forth below should be construed in view of the full breadth and spirit of the present invention as disclosed herein.

What is claimed is:

1. An RF amplifier circuit comprising:
   FET for receiving a RF input signal and generating an amplified RF output signal, the FET having a gate, drain, and source;
   control circuit, connected to the gate and drain of the FET, for controlling the current at the drain;
   dividing circuit comprising a means for biasing and variably compensating drift in the gate threshold voltage required to set the quiescent drain current, the dividing circuit being connected to the control circuit and controlling operation of the control circuit to maintain an essentially constant current at the drain in connection with a wake-up transition wherein the wake-up transition is the transistor operation or the overall circuit operation which occurs at initial start-up or a sleep or stand-by mode;
   detecting means, operably connected to the RF output signal, for detecting the power level of the RF output signal and supplying a DC voltage representative of the detected output power level;
   means for producing a variable reference voltage; and
   adjusting means, connected to the detecting means, the variable reference voltage and the dividing circuit, for automatically adjusting the drain current based at least in part on a comparison of the supplied DC voltage and the reference voltage by an amount necessary to maintain essentially constant output RF power.

2. The circuit of claim 1, further comprising a small value capacitor, operably connected to the RF output signal and the detecting means.

3. The circuit of claim 1, wherein the reference voltage is a digital computer-controlled reference voltage input, and further comprising a digital-to-analog convertor operably connected to the digital input and the adjusting means and adapted to supply a computer-controllable analog reference voltage signal to the adjusting means.

* * * * *